United States Patent
Hui et al.

[19]

[11] Patent Number: 5,933,039
[45] Date of Patent: *Aug. 3, 1999

[54] PROGRAMMABLE DELAY LINE

[75] Inventors: Titkwan Hui, Richardson; Robert W. Mounger, Dallas, both of Tex.

[73] Assignee: Dallas Semiconductor Corporation, Dallas, Tex.

[*] Notice: This patent is subject to a terminal disclaimer.

[21] Appl. No.: 08/823,708

[22] Filed: Mar. 25, 1997

Related U.S. Application Data

[63] Continuation of application No. 08/312,490, Sep. 26, 1994, Pat. No. 5,650,739, which is a continuation of application No. 07/986,327, Dec. 7, 1992, abandoned.

[51] Int. Cl.$^6$ ..................................................... H03K 5/14
[52] U.S. Cl. ........................... 327/262; 327/263; 327/270; 327/276; 327/277
[58] Field of Search ..................................... 327/261, 262, 327/263, 269, 270, 276, 271, 272, 278, 231, 237, 258

[56] References Cited

U.S. PATENT DOCUMENTS 4,994,695   2/1991   Bazes ........................................ 327/270
5,175,452   12/1992  Lupi et al. ............................... 327/277

*Primary Examiner*—Tuan T. Lam
*Attorney, Agent, or Firm*—Jenkens & Gilchrist, A Professional Corporation

[57] ABSTRACT

Digital signal delay lines with electrically programmable and trimmable delay times, including electrically erasable and reprogrammable delay times. Floating gate field effect transistors are programmed to select current, capacitance, and/or threshold and thereby set a delay time determined by acurrent charging of a capacitor up to a threshold voltage. Trimming after packaging avoids package offsets. Temperature and power supply voltage compensation by current combining gives compensation compatible with the electrical programming.

1 Claim, 21 Drawing Sheets

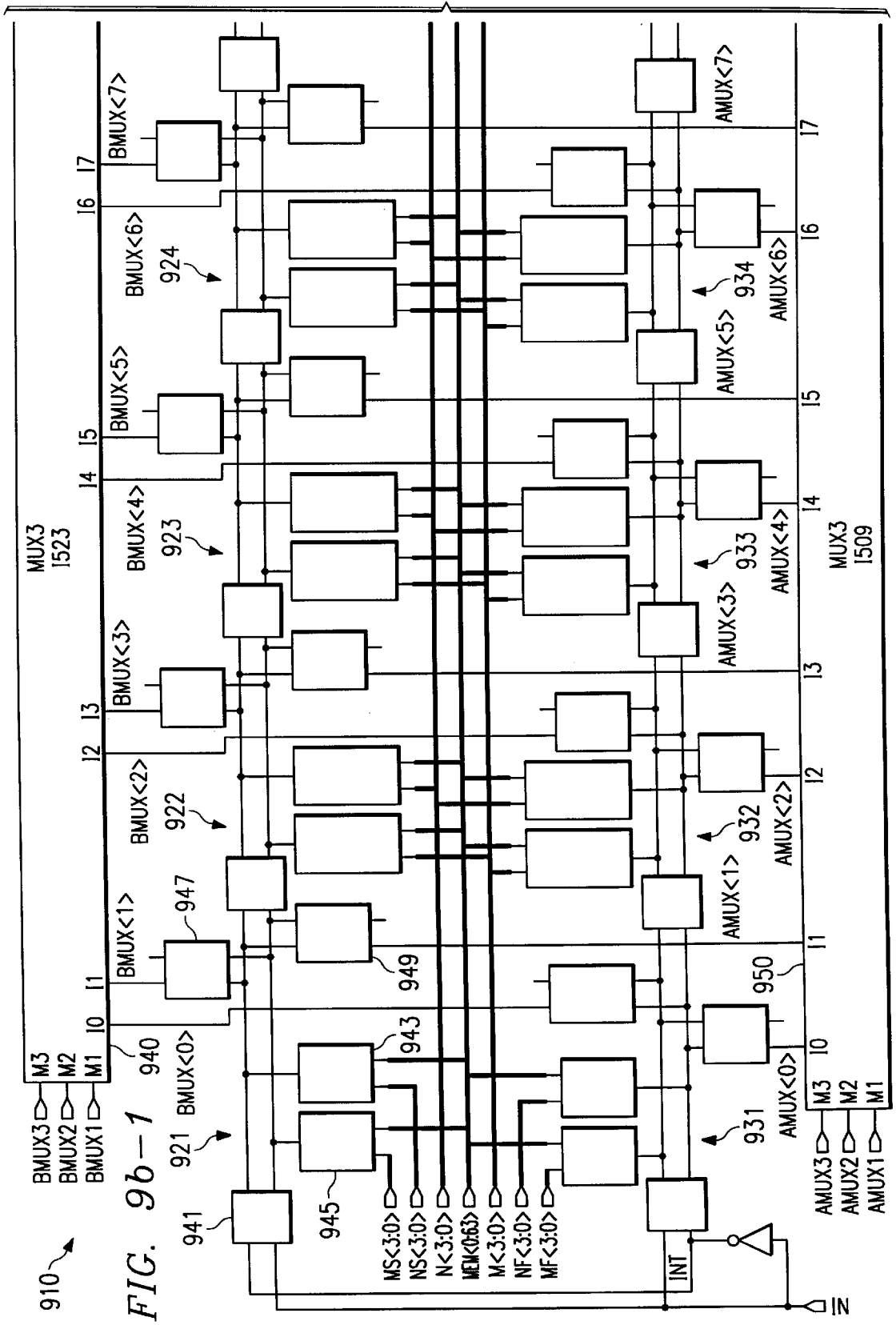

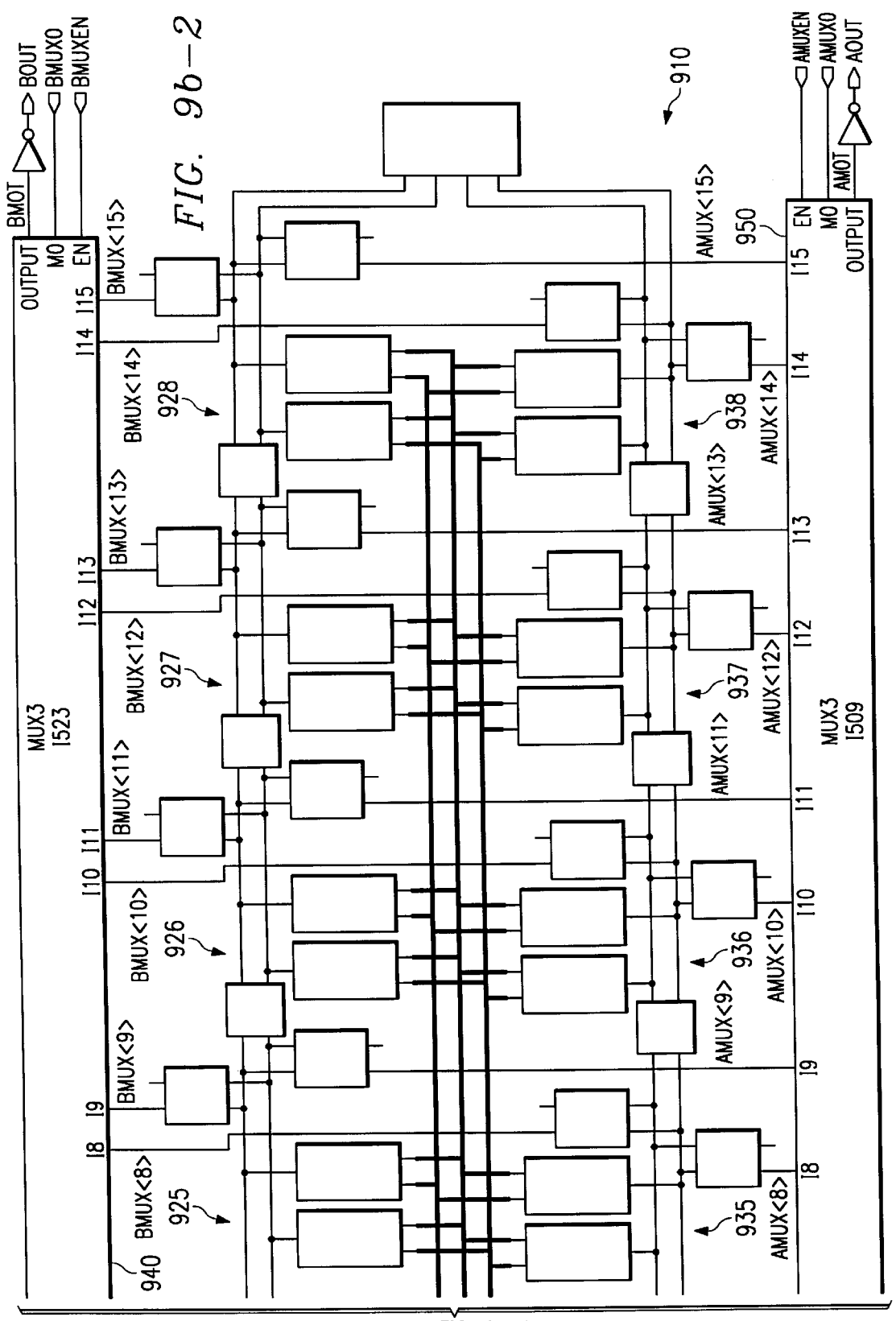

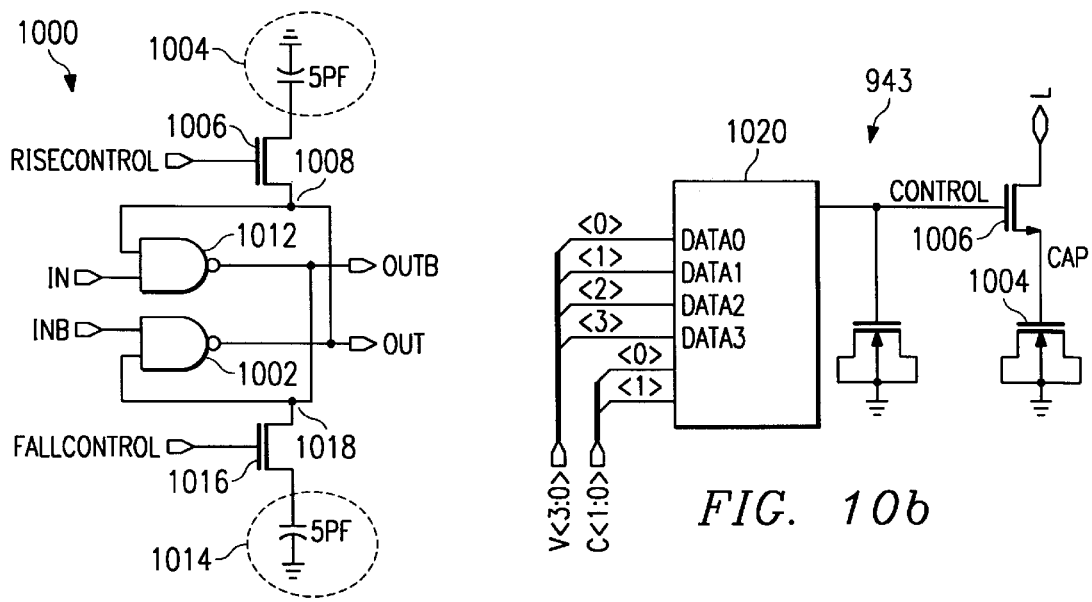
FIG. 10a
FIG. 10b
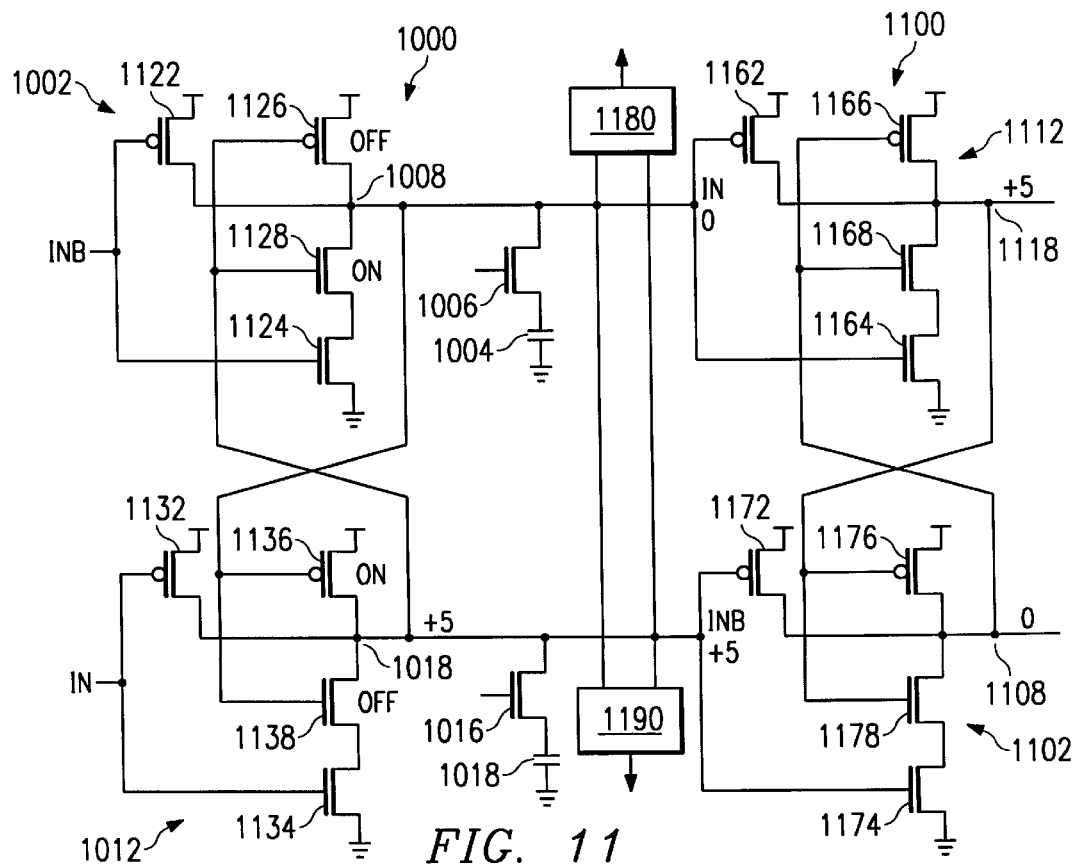
FIG. 11

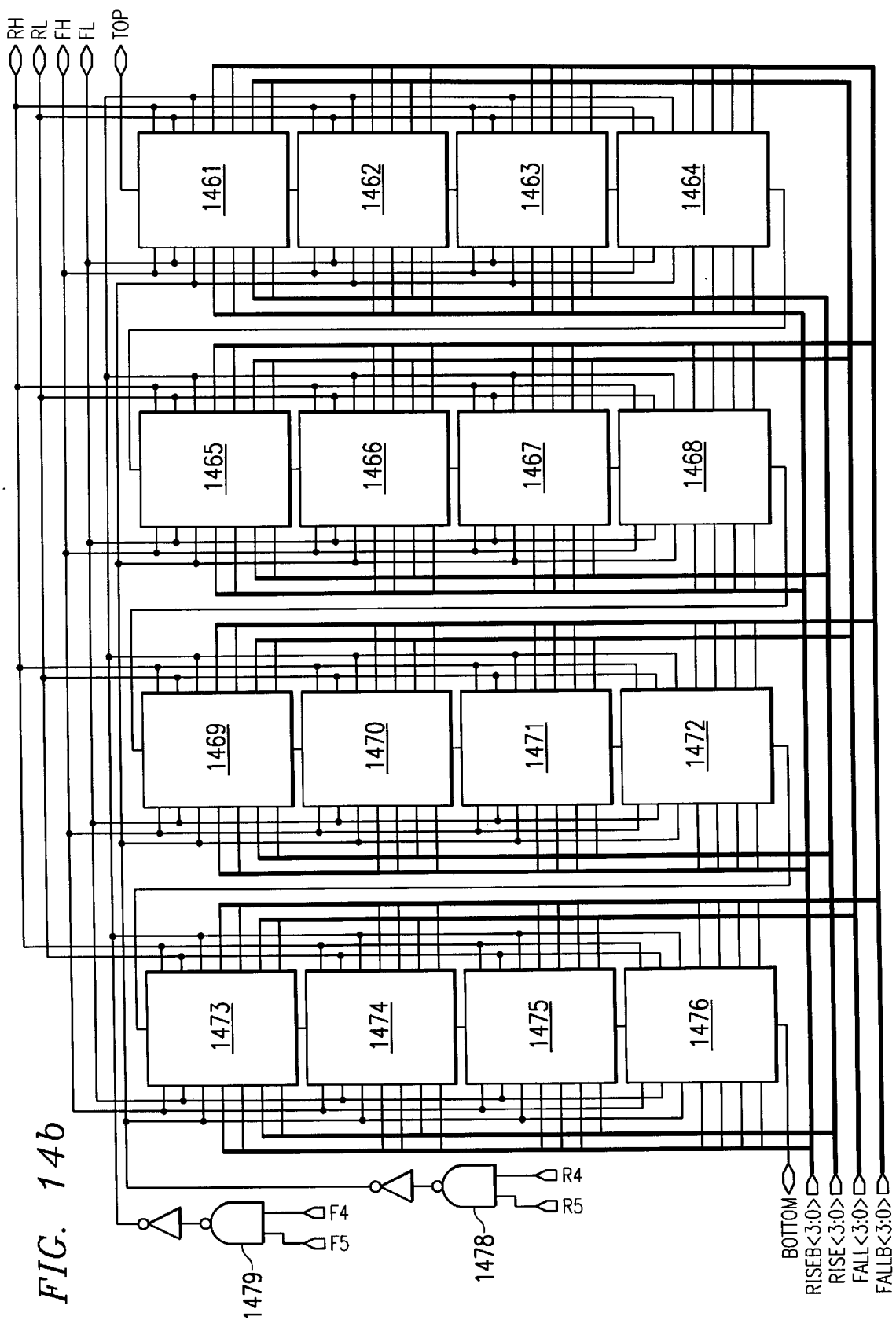

PROGRAMMABLE DELAY LINE

This application is a continuation of application Ser. No. 08/312,490, now U.S. Pat. No. 5,650,739 filed Sep. 26, 1994 which is a continuation of application Ser. No. 07/986,327, filed Dec. 7, 1992, now abandoned.

PARTIAL WAIVER OF COPYRIGHT PURSUANT TO 1077 O.G. 22 (Mar. 20, 1987)

All of the material in this patent application is subject to copyright protection under the copyright laws of the United States and of other countries. As of the first effective filing date of the present application, this material is protected as unpublished material.

Portions of the material in the specification and drawings of this patent application are also subject to protection under the maskwork registration laws of the United States and of other countries.

However, permission to copy this material is hereby granted to the extent that the owner of the copyright and maskwork rights has no objection to the facsimile reproduction by anyone of the patent document or patent disclosure, as it appears in the United States Patent and Trademark Office patent file or records, but otherwise reserves all copyright and maskwork rights whatsoever.

CROSS-REFERENCE TO OTHER APPLICATIONS

The present application contains subject matter related to that disclosed in the following application of common assignee: Ser. Nos. 374,102, filed Jun. 30, 1989, and entitled "Architecture for Programmable Delay Line Integrated Circuit" (DSC-135). This cross-referenced application is hereby incorporated by reference.

BACKGROUND AND SUMMARY OF THE INVENTIONS

The present invention relates to electronic devices, and, more particularly, to semiconductor devices useful in digital delay lines.

Designers of electronic systems often need to adjust the relative timing of various events within a system during operation and they use delay lines for such timing adjustments. For example, delay lines may be used to adjust sampling times in high-speed analog systems or to avoid possible pulse collisions in asynchronous digital systems. Various delay line products are available, both analog and digital. For example, the DS1000 family of five-tap delay lines manufactured by Dallas Semiconductor Corporation, which can reproduce an input digital pulse with delays selectable from 5 nanoseconds (nsec) to 500 nsec. Further products with delay line enhancements, such as programmable delays, are also available. These programmable delay lines permit the delay time to be varied by signals generated within the system during operation.

Delay lines commonly provide a capacitor, a current source for charging the capacitor, a reset path for rapid discharge of the capacitor, and a threshold detector. The typical digital delay line operates as follows: a pulse to be delayed is input and first disconnects the reset path and thus starts the current source charging the capacitor. The size of the capacitor and the amperage of the current source determine the rate at which the capacitor voltage increases. Then when the capacitor voltage reaches the trigger level of the threshold detector, an output pulse is generated, and the reset path quickly discharges the capacitor. Programmable delays can be achieved by control of the amperage of the current source. Indeed, if the current source has a current of I, the capacitor a capacitance of C, and the threshold detector triggers at voltage V, then the delay time is essentially VC/I.

Aspects of known delay lines can be found in the following articles: M. Bazes, A Novel Precision MOS Synchronous Delay Line, 20 IEEE J.Sol.St.Cir. 1265 (1985) and Johnson and Hudson, A Variable Delay Line PLL for CPU-Coprocessor Synchronization, 23 IEEE J.Sol.St.Cir. 1218 (1988).

Known delay lines have problems which include the laser trimmable fuses used to select the delays available. Laser trimming is a time consuming process and prevents packaging a delay line integrated circuit until the delays have been programmed by fuse blowing. Further, laser trimming fuses prior to packaging leads to a shift (offset) of the programmed delays caused by the packaging itself. See U.S. Pat. No. 4,894,791 which describes a delay mesurement of a few die while still in wafer form followed by computation of a desired delay and then laser fuse blowing in all of the die to establish the desired delays. This patent also mentions in passing that EEPROM or UVPROM could be used in place of laser blown fuses.

Known delay lines also have the problem of drift of delay time with temperature and power supply variations. Increases in temperature typically lead to increases in resistance and capacitance, and decreases in power supply voltage typically make semiconductor devices run more slowly. These variations require a delay line to have compensation circuitry for maintaining the delay time such as by adjusting the threshold voltage of the voltage detector in the case of a current charging a capacitor. However, this compensation can lead to involved circuitry in order to be compatible with non-laser trimming.

The present invention provides for an electrically trimmable programmable delay line without the use of fuses and compensates for packaging delay offset. Preferred embodiments use floating gate transistors in place of fuses, and such transistors may be programmed after packaging of the integrated circuit. Further embodiments include electrically erasable and reprogrammable floating gate transistors, and delay lines of cells with programmed loads for variance of the delays. The invention further provides temperature and power supply voltage compensation compatible with electrically trimming by adjusting capacitor charge-up currents.

BRIEF DESCRIPTION OF THE DRAWINGS

The Figures are schematic for clarity.

FIGS. 9a–b illustrate a programmable delay lines made of cells in series;

FIGS. 10a–b show a cell of the delay line of FIGS. 9a–b;

FIG. 11 illustrates operation of the cell of FIGS. 10a–b;

FIGS. 14A–14C are another diagram of various subcircuits of FIG. 9A;

FIG. 18a shows an FSK receiver incorporating the delay line of FIG. 9a;

FIGS. 18b–c are timing diagrams for the circuit of FIG. 18a;

FIG. 19 shows an FSK transmitter incorporating the delay line of FIG. 9a; and

DESCRIPTION OF THE PREFERRED EMBODIMENTS

First Preferred Embodiment: Resistor String Current Source

Figure 1A:
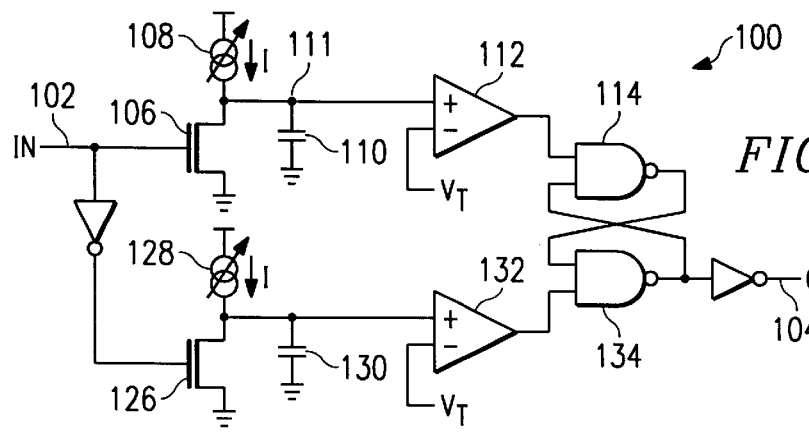
FIGS. 1a–c are circuit and timing diagrams of a first preferred embodiment delay line.

FIG. 1a is a simplified schematic diagram of a first preferred embodiment delay line, generally denoted by reference numeral 100, and including input terminal 102, output terminal 104, reset n-channel FETs 106 and 126, variable current sources 108 and 128 each with output current I, variable capacitors 110 and 130 each with capacitance C, and comparators 112 and 132 each of which has a rising variable threshold voltage of $V_T$. As described in the following, current sources 108 and 128 each includes a resistor string with the net resistance determining the current level; and programming floating gate FETs sets the net resistance. The inputs to delay line 100 for setting the variable current, variable capacitance, and variable threshold voltage have been omitted for clarity.

Figure 1B:
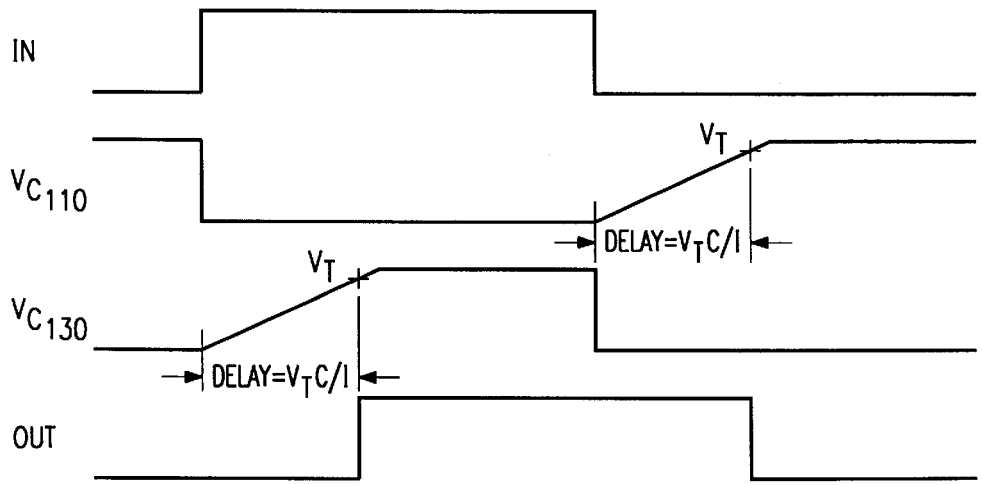

FIG. 1b is a timing diagram for delay line 100 and illustrates its operation: Start with a low at input terminal 102; this turns on FET 126 and keeps FET 106 off. Thus capacitor 130 is discharged and FET 126 directs current I from current source 128 to ground. Capacitor 110 will be charging due to current I from current source 108, and comparator 112 with output a high to NAND gate 114 and comparator 132 will output a low to NAND gate 134. This means the latch formed by the NAND gates will provide a low at output terminal 104. Next, when the input at terminal 102 switches high, FET 106 is turned on and directs the current I from current source 108 to ground and discharges capacitor 108. This switches comparator 112 to a low output, but does not switch the latch and terminal 104 remains low. But the high at terminal 102 turns off FET 126 and the current I charges up capacitor 130 until the threshold voltage $V_T$ of comparator 132 is reached; this consumes a time interval of $V_T C/I$. Once the voltage on capacitor 130 reaches $V_T$, comparator 132 switches high and this switches the latch and which drives output terminal 104 high. Lastly, when the input at terminal 102 falls to a low, then FET 106 turns off and capacitor 110 begins charging up; and FET 126 turns on to discharge capacitor 130 and switch comparator 132 low. Again, comparator 132 switching low does not switch the latch, but after a time interval of $V_T C/I$ capacitor 108 has charged up to $V_T$ and comparator 112 switches to a high output and this drives the latch to switch output termial 104 low.

Thus the delay of the rising edge and the delay of the falling edge are independently generated. For delays in the range of nanoseconds with currents in the range of microamps, capacitances in the range of femtofarads are required presuming typical CMOS voltages. Indeed, the junction capacitance of the drains of reset FETs 106 and 126 may be large enough to use as capacitors 110 and 130. Using larger currents permits the use of larger capacitors. For longer delays, larger capacitors or smaller currents may be used.

Figure 1C:
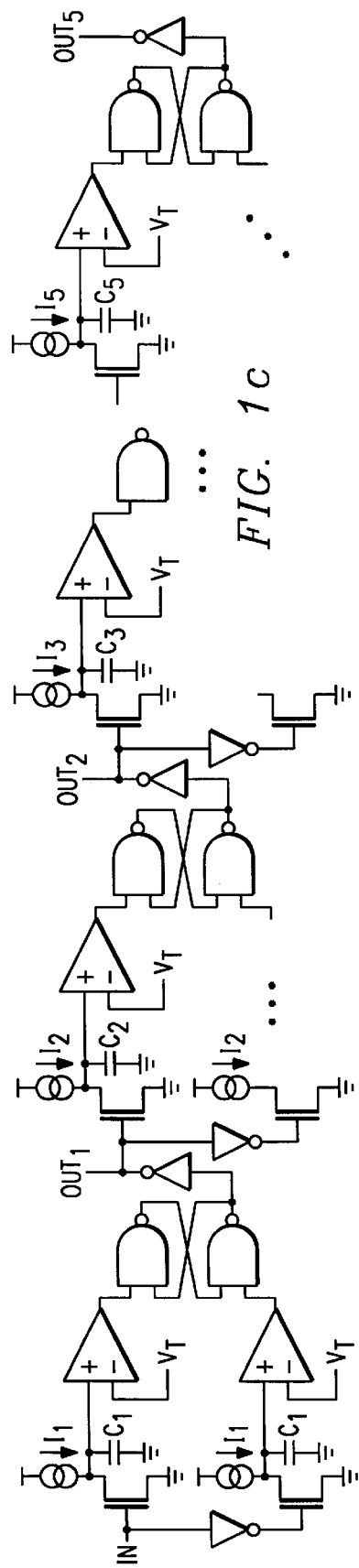

FIG. 1c shows a delay line with five taps and which is just five copies of delay line 100 in series. Thus an input high to low transition at node IN generates an output high to low at node $OUT_1$ after a time $V_T C_1/I_1$ and then an output high to low at node $OUT_2$ after a time $V_T C_1/I_1 + V_T C_2/I_2$, and so forth until a final output high to low at node $OUT_5$ after a time $V_T C_1/I_1 + V_T C_2/I_2 + \ldots + V_T C_5/I_5$. Each of the intervals $V_T C_j/I_j$ is separately programmable.

Figure 2A:
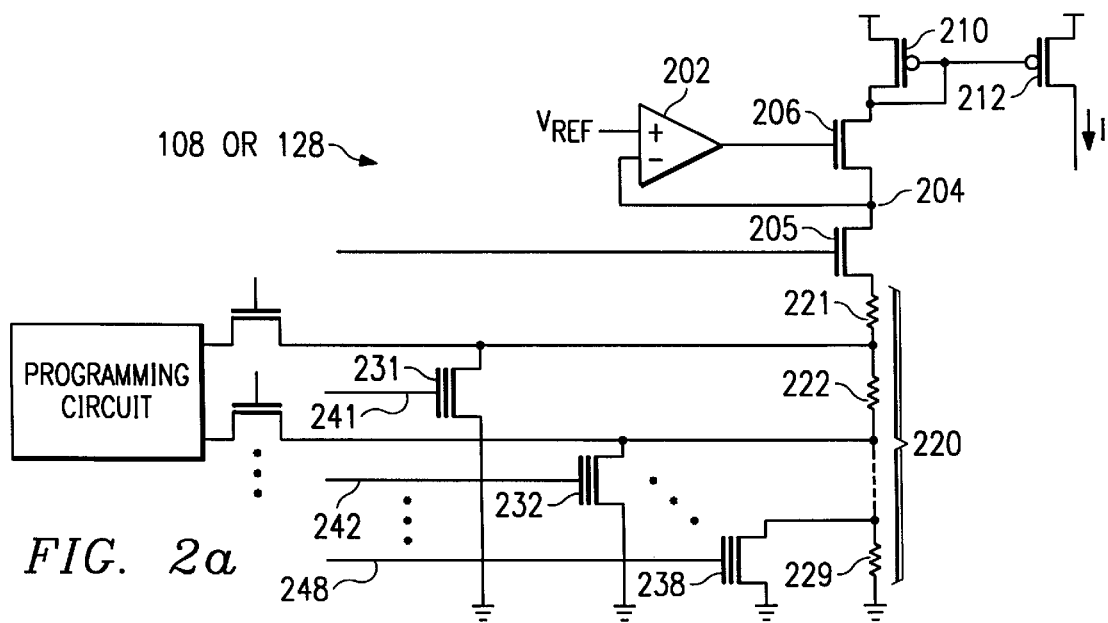
FIGS. 2a–c illustrate programmable current sources.

FIG. 2a is a schematic circuit diagram of the variable current sources 108 and 128, each of which includes opamp 202 with positive input connected to reference voltage $V_{ref}$ and negative input connected to node 204. The output of opamp 202 drives the gate of n-channel FET 206, and thus opamp 202 adjusts the conductivity of FET 206 to insure that node 204 is at a potential essentially equal to $V_{ref}$. Variable resistor string 220 connects node 204 to ground. Thus if the resistance of string 220 is R, the current out of node 204 is $V_{ref}/R$, and this current must also be the current through n-channel FET 206 and p-channel FET 210. Note that R typically is temperature dependent and that $V_{ref}$ can be made temperature dependent to compensate for the temperature dependence of R. P-channel FET 210 is diode connected between the power supply Vdd and the drain of FET 206, and p-channel FET 212 is current-mirror-connected to FET 210 and supplies the output current I of current source 108 or 128. Thus under normal operating conditions the current I supplied by FET 212 is equal to the current through FET 210 ($V_{ref}/R$) multiplied by the ratio of the gate widths of FET 212 to FET 210, presuming the gate lengths are equal. Hence, the resistance R of string 220 determines the output current I of current source 108 or 128.

Resistance R of string 220 is determined by the resistances of the individual resistors 221–229 (only nine resistors are indicated, although the number of resistors could be greater or less than nine) and which of the FETs 231–238 are turned on. That is, if FET 231 is turned on, then R equals the resistance of resistor 221; if FET 231 is turned off but FET 232 is turned on, then R equals the sum of the resistances of resistors 221 and 222; and so forth. Note that the resistors 221–229 can be fabricated by various methods in an integrated circuit: substrate resistors, polysilicon (of various doping concentrations) resistors, and resistive compounds such as cermet.

Figure 3A:
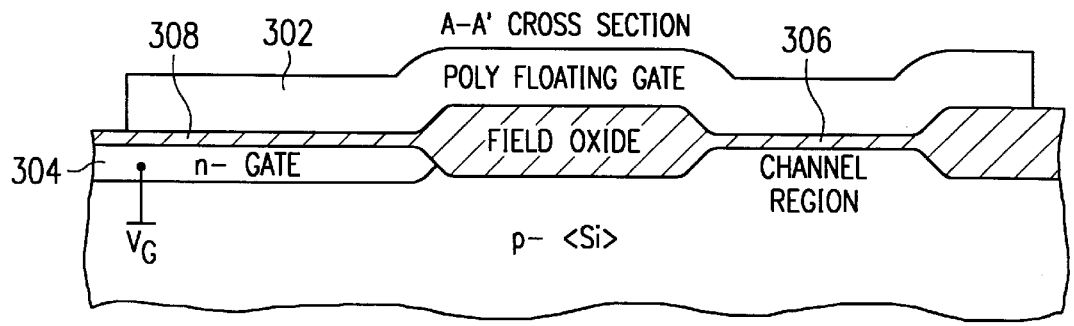
FIGS. 3a–c illustrate floating gate FETs.
Figure 3B:
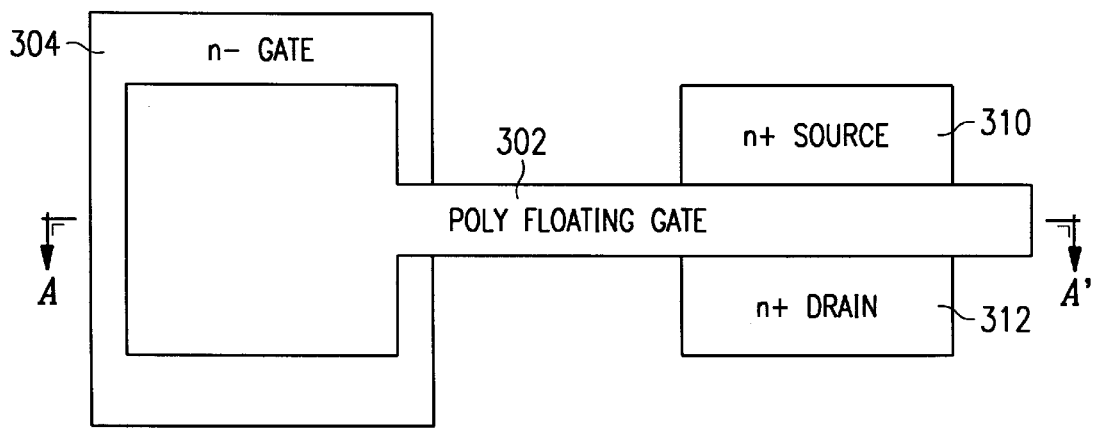
Figure 3C:
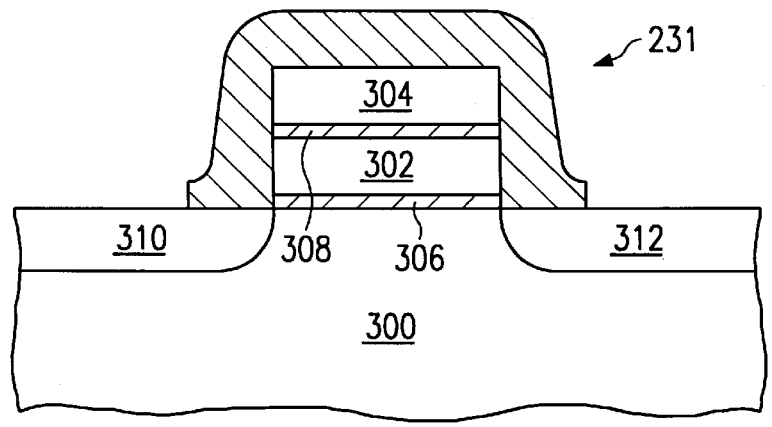

Each of FETs 231–238 is a floating gate n-channel FET which can be electrically programmed. In particular, FET 231 is formed at the surface of a p-type silicon region 300 and has a polysilicon floating gate 302 (see FIGS. 3a–c for schematic cross sectional elevational views and a plan view of two versions of the floating gate FET) and a control gate 304 with a thin gate oxide (silicon dioxide) 306 separating the floating gate from substrate 300 and a thin oxide or other dielectric 308 separating control gate 304 from floating gate 302. In the version of FIG. 3a the control gate is a diffused n-type region of a p-type silicon substrate and in the version of FIG. 3c the control gate is formed in a second polysilicon layer. The source 310 and drain 312 are n-type silicon regions. Control line 241 connects to control gate 304. FET 231 operates as follows, persuming a typical 5 volt CMOS type FET with a 12 volt programming voltage.

If there is no net charge on floating gate 302, then the threshold voltage on control gate 304 to turn on FET 231 is about +1 volt; whereas, if floating gate 302 has a negative net charge as results from programming described below, then the threshold voltage increases to about +6 volts. Thus if a 5 volt high signal is applied to control lines 241–248 and thus to the control gates of FETs 231–238, then the FETs with uncharged floating gates will turn on and the ones with negatively charged floating gates will remain off.

Floating gate FETs 231–238 can be programmed by avalanche injection of hot electrons or by tunneling. The choice of programming method will affect the design details. For avalanche injection (FAMOS), the control gate may be held at +12 volts and the drain-to-source voltage increased until sufficiently hot electrons are generated near the drain 312 to inject through the gate oxide 306 into floating gate 302. This injection of electrons into floating gate 302 raises the threshold voltage of the FET and reduces the current. With a 225 A thick gate oxide and 225 A thick dielectric between gates, a drain-to-source voltage of about 6 volts will typically lead to programming. Note that FAMOS EPROMs typically have an ultraviolet light transparent window in their packaging if erasure of the programmed floating gates is needed. Contrarily, delay line 100 will be programmed with a delay and typically never reprogrammed; thus the erasure aspects are not needed. Note that FET 205 is used to isolate the floating gate FETs and resistors from the remainder of the current source during programming.

Alternatively, application of +15 to +20 volts to control line 241 and thus to control gate 304 will tunnel electrons from grounded source 310 and drain 312 through gate oxide 306 and into floating gate 302; this programming method typically uses a thinner gate oxide to avoid high voltages. Contrarily, application of −12 volts to control line 241 and thus control gate 304 will tunnel electrons from floating gate 302 back into source 310 and drain 312 to dischrage floating gate 302. Note that this reverse bias erasure cannot be used with the device of FIGS. 3a–b because the p-n junction of the control gate in the substrate would be foward biased. Gate oxide 306 should have a thickness of about 150 A for high tunneling rates, and separation oxide 308 should be about 250 A thick to avoid breakdown during programming. Because the programming of the floating gates will only occur to set the delay time, the efficiency of the tunneling is not crucial and the programming voltages can be externally applied rather than by charge pumps incorporated on chip. An alternative type of programmable FET could also be used, such as MNOS or textured polysilicon.

Figure 2C:
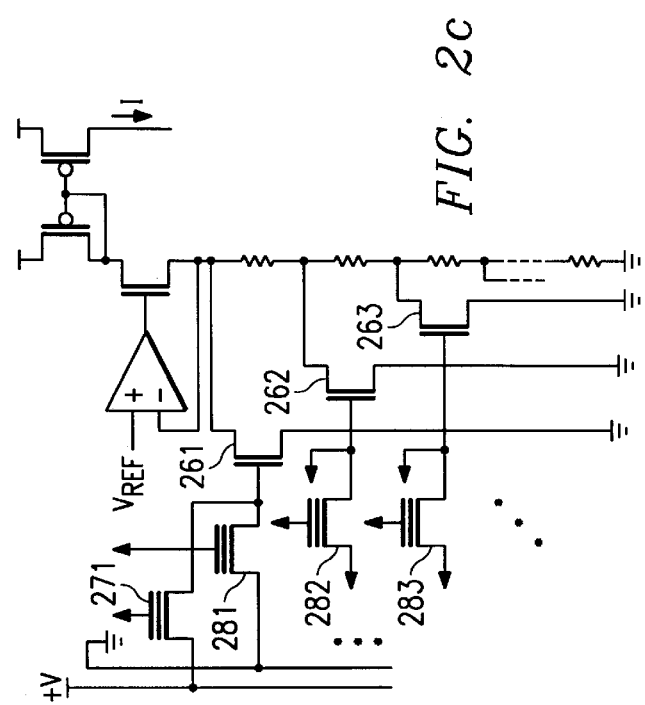
Figure 2B:
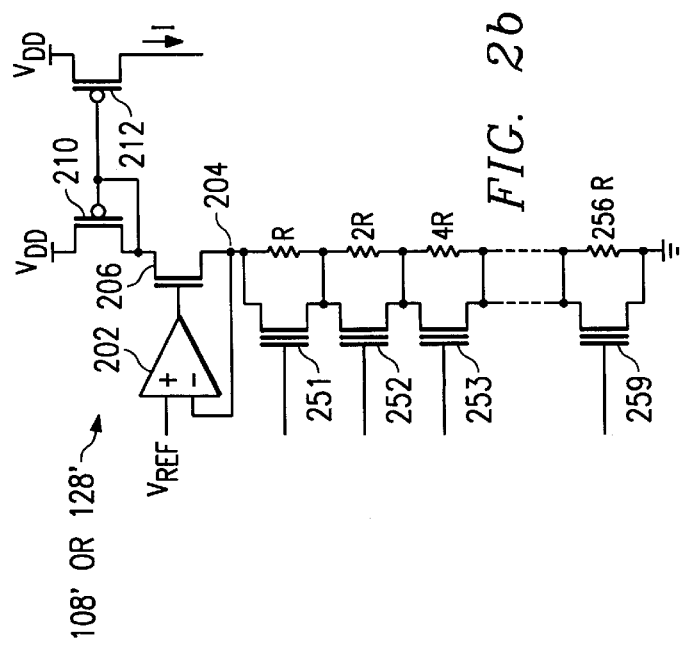

FIG. 2b shows an alternative programmable current source 108' or 128' which is similar to the programmable current source 108 or 128 illustrated in FIG. 2a but with more resistor combinations programmable for more output current levels. Indeed, each of floating gate FETs 251–259 may be programmed to have either a high or low threshold, and thus the binary-weighted resistors can be combined to provide 511 different nonzero resistances R. Hence the programmable current source 108' of FIG. 2c used in delay line 100 can provide 511 different delay times. Of course, with more or fewer resistors the number of different delay times obtainable can be increased or decreased.

A further version of the variable resistor strings 108 and 108' appears in FIG. 2c and separates the programmed FETs from the FETs bypassing the resistors. In particular, FETs 261, 262, 263, . . . have their gates connected through floating gate FETs 271, . . . to +V volts and through floating gate FETs 281, . . . to ground. The floating gate FETs are programmed so that one of each pair connected to each FET 261, 262, . . . is programmed to have a high threshold and the other has a low threshold. Thus application of an intermediate voltage to all of the control gates will turn on just one of each pair 271–281, . . . and thereby turn on or off each of FETs 261, 262, . . . The advantage of having the floating gate FETs separate from the resistor bypass FETs is that the applied voltage +V may be less that the usual +5 volts in order to avoid softwrite: unprogrammed FETs will experience increases in their threshold voltages due to low level electron injection into the floating gates during reads.

Second Preferred Embodiment: Programmable Capacitance

The second preferred embodiment delay line also has the components as shown in FIG. 1a, but rather than programming the current from current source 108 to adjust the delay time, the capacitance C of capacitor 110 is programmed.

Figure 4:
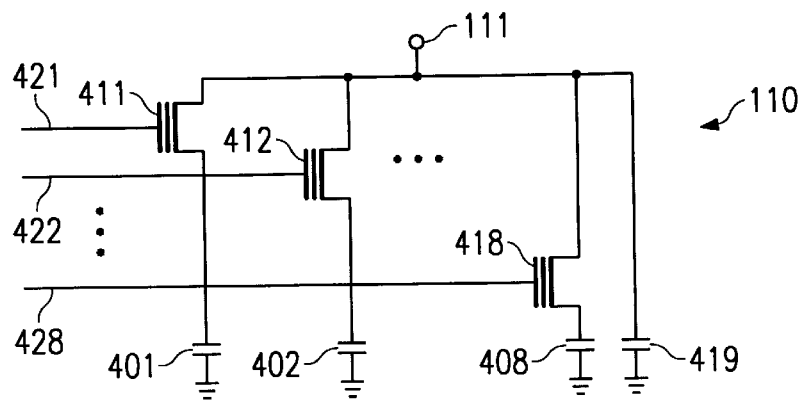
FIG. 4 shows a programmable capacitor.

FIG. 4 shows variable capacitor 110 as an array of parallel individual capacitors 401–409, although more or less than nine individual capacitors could be used, and capacitor 409 represents the stray capacitance of node 111, including the junction capacitance of the drain of reset FET 106. Each individual capacitor has one of floating gate FETs 411–418 connecting it to node 111. Capacitor 110 may be programmed in the same manner as the current source 108'; that is, each of the floating gate FETs 411–418 may be programmed to change its threshold voltage. Thus when a bias is applied to all of the control gates, the FETs without a charge of electrons on their floating gates will turn on and connect their capacitors to node 111 to increase C, and the programmed FETs will remain off and isolate their capacitors. Capacitors 401–408 may be formed with the gate of a FET as one plate, the gate oxide as the insulator, and the source, drain, and channel region as the grounded plate. Alternatively, poly to poly capacitors may be used.

If the capacitance of capacitor 401 is twice the capacitance of capacitor 402 which, in turn, is twice the capacitance of capacitor 403, and so forth, and with the capacitance of capacitor 408 equal to that of capacitor 409, then this array of nine capacitors may be programmed to any of $2^8$ (256) equispaced capacitances. Thus 256 equispaced (ignoring propagation delays) time delays are available. And if a variable current source 108 as in the first preferred embodiment were combined with this variable capacitor 110, then even a greater number of time delays would be available.

Third Preferred Embodiment: Programmable Detector Threshold

Figure 5:
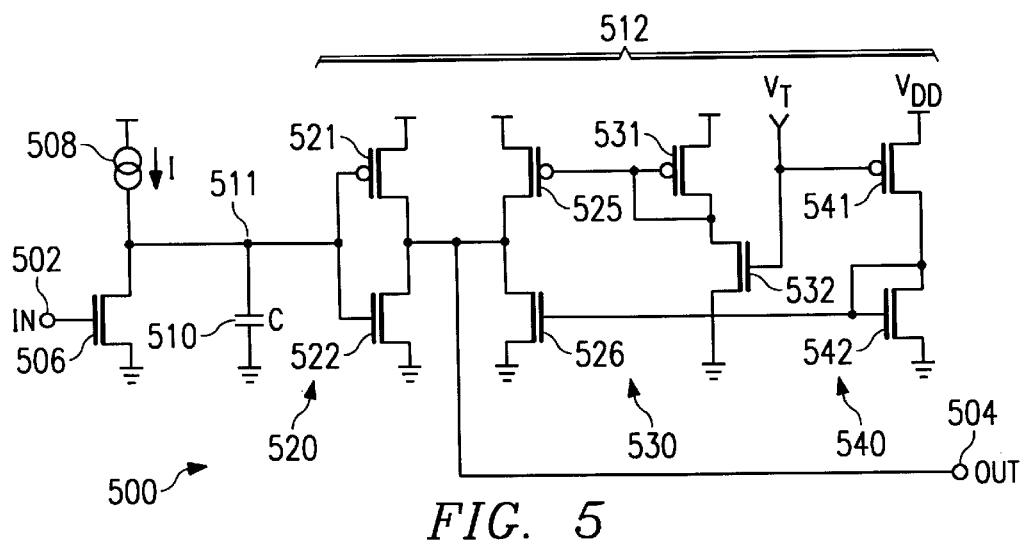
FIG. 5 is a schematic circuit diagram of a third preferred embodiment delay line.

A third preferred embodiment delay circuit has components as in FIG. 1a but with the threshold voltage $V_T$ of comparator 112 variable and current source 108 and capacitor 110 fixed. In particular, FIG. 5 shows delay line 500 that has comparator 512 with adjustable $V_T$. Delay line 500 includes input node 502, reset n-channel FET 506, current source 508, capacitor 510, and comparator 512 which has inverter 520 and mirrors 530 and 540 both feeding output node 504. Mirror 530 has $V_T$ driving n-channel FET 532 and mirrors this through p-channel FETs 531 and 525; mirror 540 has $V_T$ driving p-channel FET 541 and mirrors this through n-channel FETs 542 and 526. Thus if the p-channel FETs 521 and 541 have the same gate widths and lengths and likewise the n-channel FETs 522 and 532 have the same gate widths and lengths, then the output at node 504 is low if the voltage on capacitor 110 (node 511) is less than $V_T$ and high if voltage is greater than $V_T$. That is, $V_T$ sets the threshold for inverter 520 as follows. $V_T$ establishes the saturation currents of FETs 541 and 532, and these determine the currents mirrored by FETs 542–526 and 531–525, respectively. Similarly, the voltage at node 511 establishes the saturation currents of FETs 521 and 522. Thus if $V_T$ is greater than the voltage at node 511, then the saturation current of FET 532 is greater than that of FET 522, so the current mirrored by FET 525 from FET 532 is greater than FET 522 can handle, and similarly the saturation current of FET 541 is less than that of FET 521, so the current mirrored by FET 526 from FET 541 is less than FET 521 can handle; thus the voltage at output node 504 is driven high. Conversely, if $V_T$ is less than the voltage at node 511, then the saturation current situation is reversed and output node 504 goes low.

Figure 6A:
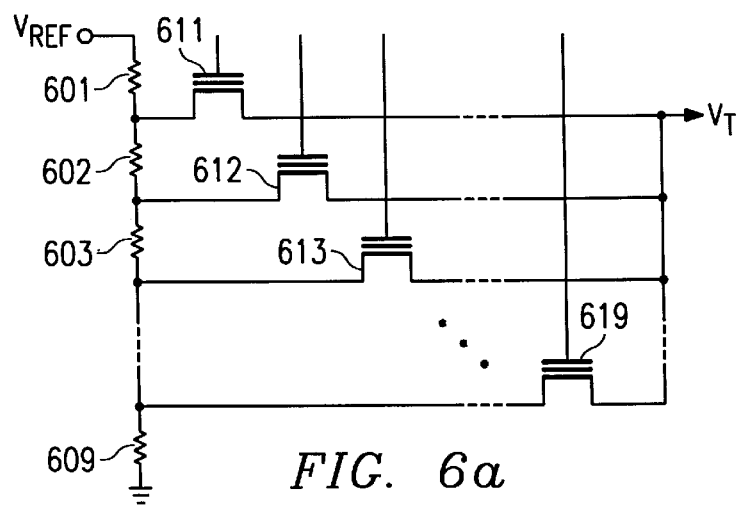
FIGS. 6a–b illustrate programmable threshold voltage sources.
Figure 6B:
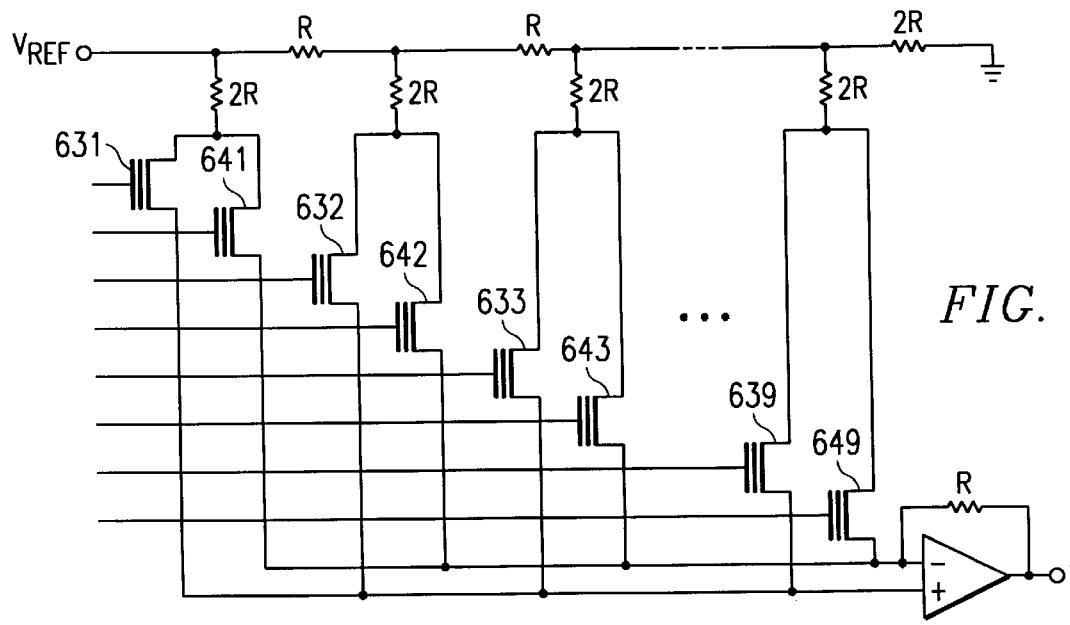

$V_T$ may be programmed by a simple voltage divider as shown in FIG. 6a. $V_{ref}$ may be a temperature independent voltage source (such as a bandgap generator) because only the ratios of the resistors 601–609 affects $V_T$, and floating gate FETs 611–619 are programmed so that only one of them is turned on and determines $V_T$. of course, more or fewer resistors can be used and the number of floating gate FETs goes up linearly with the number of $V_T$ levels. Alternatively, $V_T$ may be set by a using a current-scaling digital-to-analog converter as shown in FIG. 6b. In this case the resistors form an R–2R ladder and the pairs of floating gate FETs 631–641, 632–642, 633–643, . . . , 639–649 are programmed so that one FET of each pair has a low threshold voltage and the other FET of each pair has a high threshold voltage. This ladder arrangement permits the nine resistor and FET pairs shown to generate 512 different levels for $V_T$ and thus 512 different delay times.

Delay line 500 may also use a programmable current source as in FIGS. 2a–b for current source 508 and a programmable capacitor as in FIGS. 4a–b for capacitor 510 in addition to a programmable $V_T$ for comparator 512; this would allow more range and number of delay times programmable.

Figure 7:
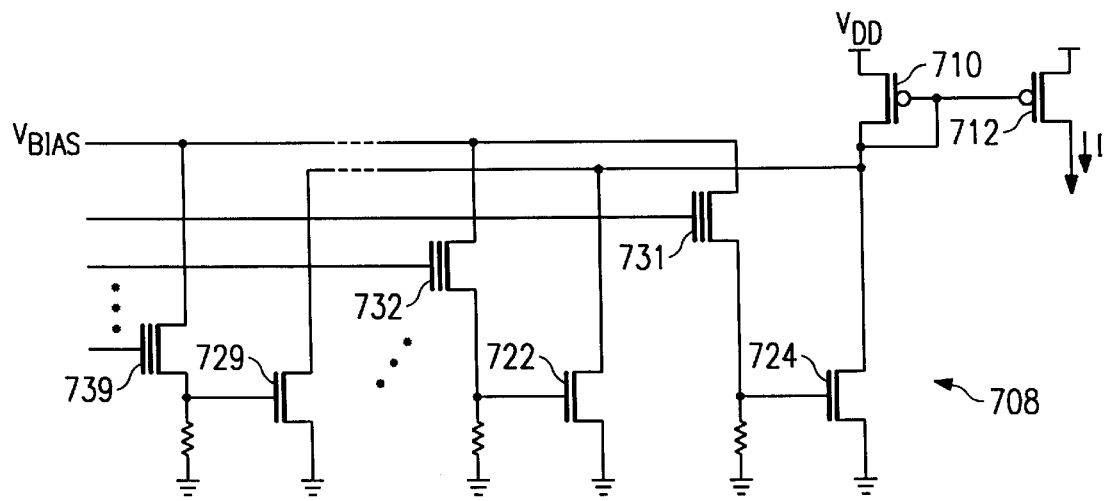
FIG. 7 shows an alternative programmable current source.

FIG. 7 illustrates an alternative programmable current source, generally denoted 708 and substitutable for current source 108 of FIG. 1a. Current source 708 is programmed by setting the threshold voltages of floating gate FETs 731–739, and these FETs determine whether n-channel FETs 721–729 are off or on. FETs 721–729 have binary-weighted gate widths and thus saturation currents, so by programming floating gate FETs 731–739, 512 different currents can be drawn trough p-channel FET 710 and thus mirrored to form the current supplied by current source 708. The number of FETs can be increased or decrased to provide more or fewer available current levels. The gate bias $V_{bias}$ for FETs 721–729 can be generated to compensate for the temperature dependence of the saturation current of FETs 721–729, and thus the patterning accuracy of the gates of FETs 721–729 and the gate oxide thickness and channel region doping level accuracy will determine the precision of the current source.

Figure 8:
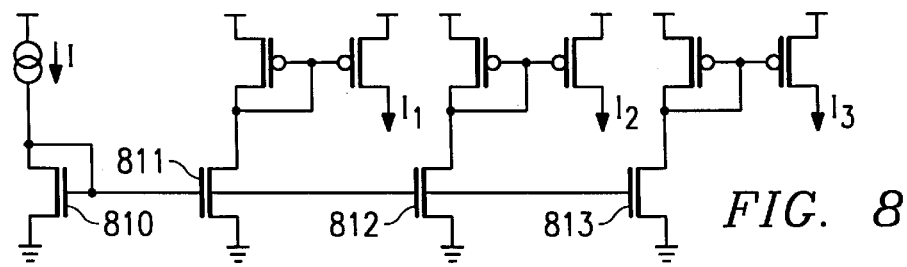
FIG. 8 shows multiple current sources.

Several delay lines may be constructed with a single fixed current source by multiple current mirrors as illustrated in FIG. 8. The ratio of the current $I_1$ to the current I is set by the ratio of the gate width of n-channel FET 811 to the gate width of n-channel FET 810. Similarly for currents $I_2$ and $I_3$. Thus several delay lines may be formed in a single integrated circuit, and by the use of programmable capacitors or programmable threshold voltages or both the several delay lines can be separately programmed to set their time delays.

Fourth Preferred Embodiment: Programmable Channel Resistance

Figure 9A:
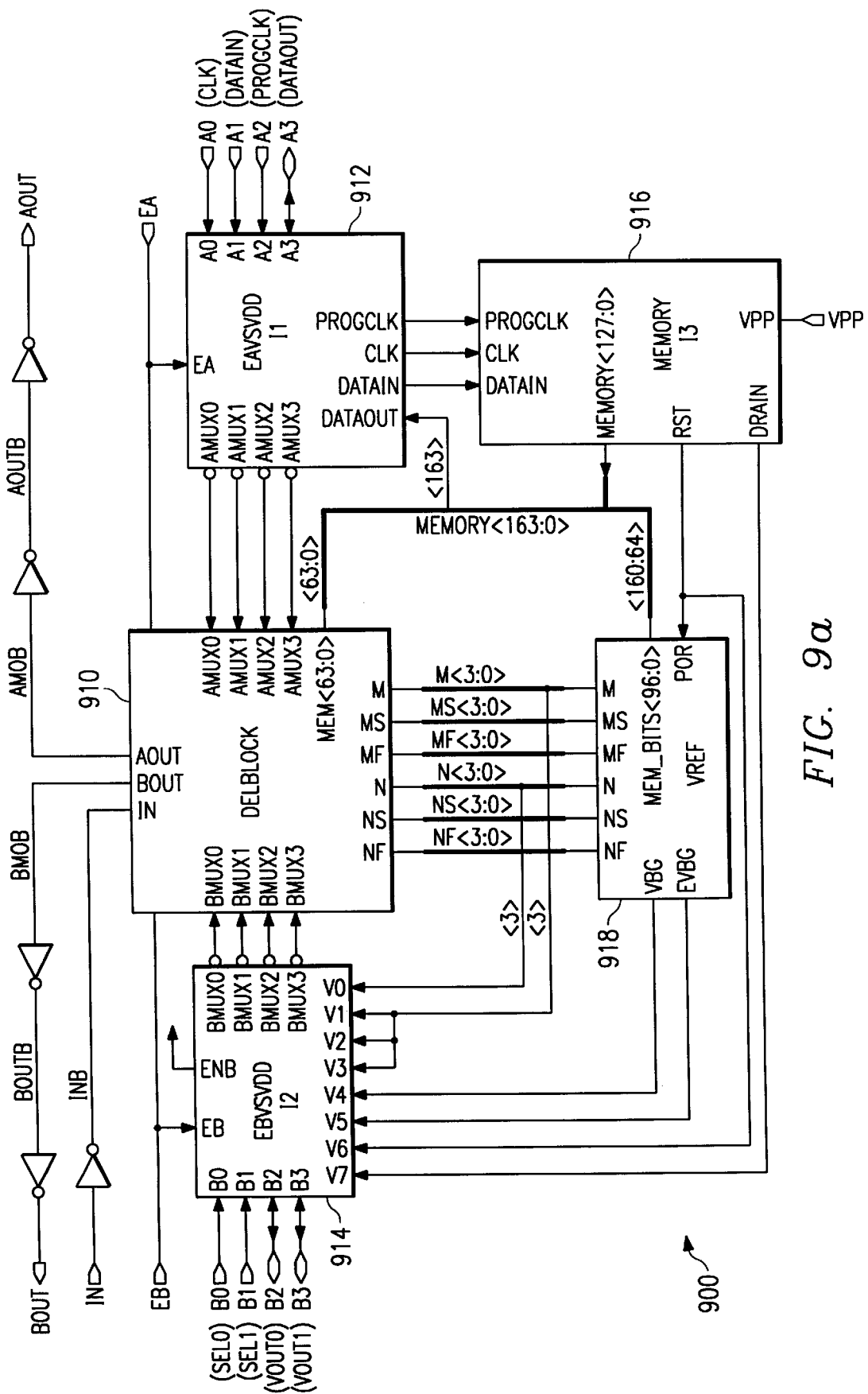

Fourth preferred embodiment delay line, generally denoted by reference numeral 900 and shown in block form in FIG. 9a, provides for two independently programmed delayed versions of a single input. In particular, delay line 900 includes delay block 910, interface blocks 912 and 914, EPROM memory block 916 for trimming, block 918 supplying compensated reference voltages, and terminals IN for input of the pulse to be delayed, AOUT for a first delayed output pulse, BOUT for a second delayed output pulse, EA to enable program select for the A delay, EB to enable program select for the B delay, A0–A3 to program the delay for the AOUT output pulse, B0–B3 to program the delay for the BOUT output pulse, and VPP for the EPROM programming high voltage. Essentially, the 4-bit input at A0–A3 is decoded to select one of 16 possible delays of IN to be output at AOUT, and similarly a 4-bit input at B0–B3 is decoded to also select one of the 16 possible delays of IN to be output at BOUT. The delays are compensated for variations in temperature and power supply voltage, and have an adjustable nominal offset.

Delay block 910, shown in FIG. 9b, has input IN (plus inverted IN) feeding eight delay cells 921–928 in series plus feeding a parallel eight delay cells 931–938 in series, together with output 16-to-1 multiplexers 940 and 950 which tap off of each of the sixteen delay cells to generate (through inverter output drivers) the AOUT and BOUT outputs. The two parallel sets of delay cells are staggered in time. The 4-bit inputs BMUX0–BMUX3 and AMUX0–AMUX3 from interfaces 914 and 912 control the 16-to-1 multiplexers 940 and 950, respectively. The first delay cell, 931, has a nominal signal propagation delay of 5 nsec and feeds the BMUX<0> and AMUX<0> inputs of multiplexers 940 and 950. The second delay cell, 921, has a nominal propagation delay of 7.5 nsec and feeds the BMUX<1> and AMUX<1> inputs. Each of the other delay cells, 932–938 and 922–928, has a nominal propagation delay of 5 nsec. Hence, multiplexers 940 and 950 each has a selection of inputs with nominal delays of 5, 7.5, 10, 12.5, 15, . . . 42.5 nsec from which to provide its output.

Delay line 900 also multiplexes the delay programming inputs A0–A3 and B0–B3 with EPROM trim programming I/O to lower the pin count for a packaged integrated circuit. After a packaging of delay line 900, electrical digital trimming of various elements adjusts the delays to their nominal values, and this trimming is stored in EPROM memory block 916. In particular, application of EPROM programming high voltage to the EA and EB terminals permit the 160 trim bits to be serially entered through terminal A1 into a shift register by clocking at terminal A0. These trim bits set the trim of delay line 900 and the delays can then be tested. If the trim bits provide the correct trim, then taking the VPP terminal high will program the EPROM cells to store these bits and delay line 900 will be ready for use; contrarily, if the trim bits do not provide the correct trim, the a new set of trim bits may be serially loaded into the register and tested. On each power up the trim bits stored in the EPROM memory will be loaded into the register and set the proper trim. To read the register, the trim bits may be clocked out at terminal A3. And to limit the current draw at the VPP terminal during programming, the 160 trim bits are partitioned into blocks and on each cycle of the programming clock PROGCLK at terminal A2, a block of bits are stored in the EPROM cells.

Each delay cell has the structure of cell 1000 shown in FIG. 10a with the RS latch formed of NAND gates 1002 and 1012 represented as block 941 for cell 921 in FIG. 9b, with load capacitor 1004 and n-channel FET 1006 plus a multiplexer for the gate voltage selection (see FIG. 10b) represented as block 943 for cell 921, and with load capacitor 1014 and n-channel FET 1016 plus a multiplexer for the gate voltage selection (again FIG. 10b) represented as block 945 for cell 921. Similarly all of the other cells are shown as a latch block plus two capacitor blocks which are analogous to blocks 941 and 943 plus 945, respectively. As FIG. 10b illustrates, the 2-bit input c<1:0> drives multiplexer 1020 to select one of the four voltages v<3:0> to apply to the gate of the n-channel FET 1006. FIGS. 9a–b show that the two bits c<1:0> for block 943 are bits 35 and 34 on the bus MEM<0:63> from memory block 916 and the four voltages v(3:0) are the four voltages on bus NS<3:0> from compensated reference voltage block 918. Similarly, the two bits c <1:0 > for block 945 are bits 33 and 32 on the bus MEM<0:63> and the four voltages v(3:0) are the four voltages on bus MS<3:0>. The other cells 922–928 and 932–938 likewise have gate voltages determined by the busses N<3:0> and M<3:0> (delay cell 931 uses NF<3:0> and MF<3:0>) with selection by bit pairs on bus MEM<0:63>, as will be detailed after an explanation of the operation of the delay cell. The tap from cell 921 to multiplexer 940 has buffer 947 and the tap to multiplexer 950 has buffer 949. Similarly, the taps from the other cells have buffers. These buffers can be latches similar to cross coupled NAND gates 1002–1012, but the latches will not have the capacitive loading and will sharpen up their inputs. The delay cell of FIG. 10a operates as follow.

FETs 1006 and 1016 effectively provide selectable resistance resistors connecting load capacitors 1004 and 1014 to nodes 1008 and 1018, respectively. When FETs 1006 and 1016 have a high channel resistance (e.g., turned off), then the load capacitors 1004 and 1014 have little effect; but when FETs 1006 and 1016 have minimal channel resistance, then load capacitors 1006 and 1016 effectively introduce more stray capacitance to nodes 108 and 1018 which slows down the voltage transitions of NAND gates 1002 and 1012 and thereby increases the delay introduced by delay cell 1000.

In particular, first consider a state with the INB input to NAND gate 1002 high, the IN input to NAND gate 1012 low, and less than I volt applied to the gates of FETs 1006 and 1016; that is, FETs 1006 and 1016 are turned off. FIG. 11 shows delay cell 1000 together with the latch of following delay cell 1100. Output buffers 1180 and 1190 correspond to buffers 947 and 949 in FIG. 9b. NAND gates 1002 and 1012 are presumed to be standard 5-volt CMOS devices, with threshold voltage magnitudes of both p-channel FETs and n-channel FETs taken to be about 1 volt. Now the low IN input to NAND gate 1012 turns on p-channel FET 1132 and turns off n-channel FET 1134 which drives its output node 1018 high. Thus NAND gate 1002 has two high inputs (INB and node 1018) and has p-channel FETs 1122 and 1126 both turned off and n-channel FETs 1124 and 1128 both turned on and thus a low output node 1008. Hence, p-channel FET 1136 is turned on and n-channel FET 1138 is turned off.

Figure 12A:
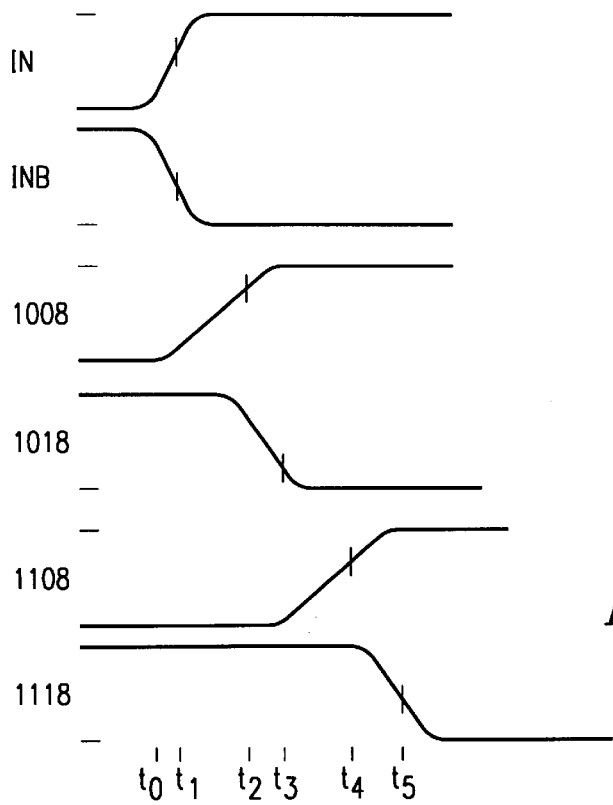
FIGS. 12a–b are a timing diagram and delay time for the cell of FIGS. 10a–b.

Now consider the IN input to NAND gate 1012 ramping up to high beginning at time $t_0$ and that essentially simultaneously the INB input begins ramping down to low. See the lefthand portion of timing diagram FIG. 12a. When IN has increased to 2 volts, FET 1134 turns on weakly and FET 1132 remains on although less strongly. However, node 1008 near low (at most 1 volt) implies FET 1138 remains off and FET 1136 remains on to hold node 1918 at high. Similarly, INB falling to 3 volts has weakly turned on FET 1122 but kept FET 1124 on to hold node 1008 near low. Indeed, the stray capacitance at node 1008 must be charged up by current through FET 1122 to raise the potential of the node, so as long as the current supplied by FET 1122 can be sunk by FETs 1124 and 1128, node 1008 will remain near low.

The saturation current of a FET is proportional to $(V_{GS}-v_T)^2$. Thus once IN has risen to 3 volts and INB dropped to 2 volts, FET 1122 will overpower FETs 1124–1128 and be charging up the stray capacitance of node 1008 and raising its potential. See time $t_1$ in FIG. 12a. When node 1008 reaches about 3 volts (time $t_2$ in FIG. 12a) it will have turned on FET 1138 harder than FET 1136, and node 1018 will begin discharging its stray capacitance through FETs 1134 and 1138 in series despite the parallel (weakly) turned on pull up by FETs 1132 and 1136. The time required by FET 1122 to charge up the stray capacitance of node 1008 to about 3 volts depends upon the current capacity of FET 1122 and the stray capacitance magnitude. The stray capacitance at node 1008 includes the gate capacitance of FETs 1136 and 1138, input gate capacitance of NAND 1102 of following cell 1100, and the input capacitance of buffers 1180 and 1190. Buffers 1180 and 1190 may be taken to be latches of the same structure as the latch 1102–1112, and thus the buffers' input capacitance would just be twice that of NAND 1102. Similarly, the time to discharge node 1018 by FETs 1134–1138 depends upon their current capacity and the stray capacitance of the node, which is analogous to that of node 1008. See FIG. 12a, time $t_3$ which indicates node 1018 having fallen to 2 volts.

The potential of node 1018 is the IN input to following cell 1100, and the potential of node 1008 is the INB input. Thus at time $t_2$ when node 1008 has reached 3 volts, pull down FET 1164 will be on harder tan pull up FET 1162, but node 1118 will remain high due to node 1108 being low and keeping FET 1168 off and FET 1166 on. Then at time $t_3$ when node 1018 has fallen to 2 volts, pull up FET 1172 will be on harder than pull down FET 1174 and will start charging up the stray capacitance of node 1108; see FIG. 12a. After time $t_4$ node 1108 reaches about 3 volts and turns on pull down FET 1168 and turns off pull up FET 1166 to begin the discharging of node 1118. That is, the behavior of cell 1100 repeats that of cell 1000, and the cell following cell 1100 provides another repeat. Note that the rising IN signal is delayed by one stray capacitance discharge ($t_2$ to $t_3$) followed by one stray capacitance charge up ($t_3$ to $t_4$) as it propagates through a delay cell, and that the falling INB signal is similarly delayed and lags by a discharge time. The initial simultaneous rising of IN and falling INB, which would possibly occur only in first cell 931 and second cell 921, was changed to a falling INB lagging after passing through one delay cell.

The symmetry of delay cell 1000 implies that the opposite case of IN falling and INB rising leads to a symmetric propagation: the falling IN will lag the rising INB by one stray capacitance discharge time.

Figure 12B:
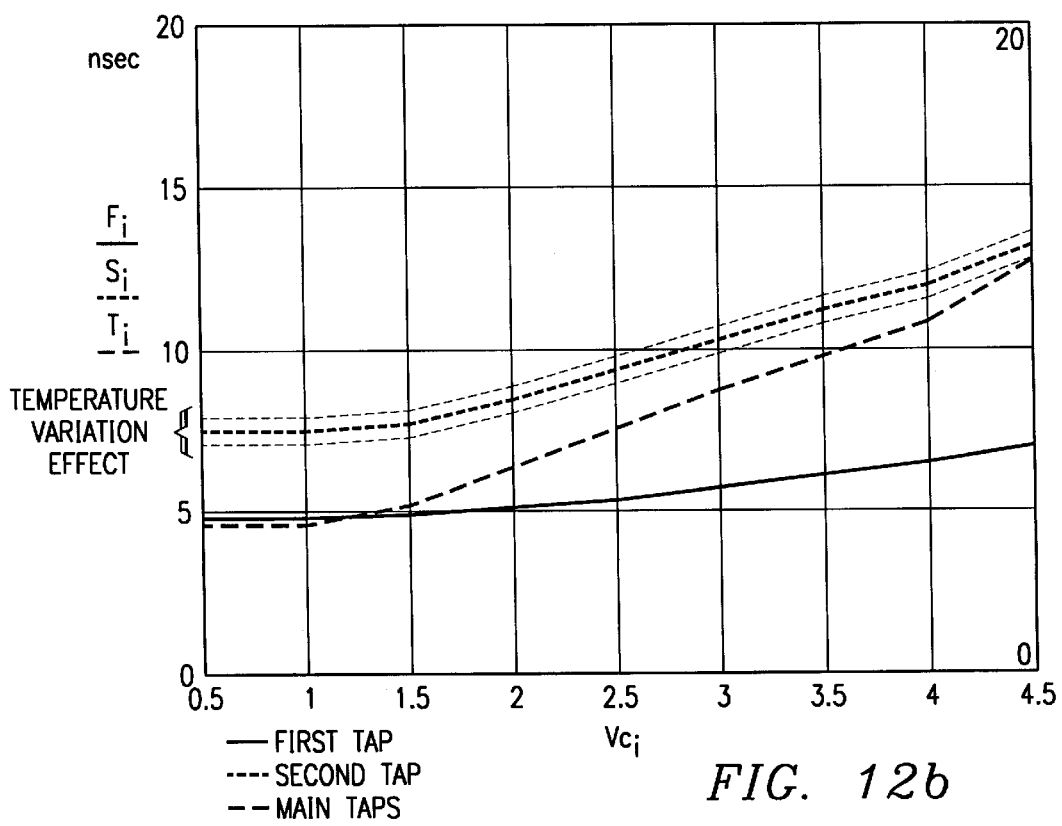

When the gate voltages applied to FETs 1006 and 1016 are above threshold voltage, the FETs are turned on and thereby connect load capacitors 1004 and 1014 to nodes 1008 and 1018, resepctively, through an impedance dependent upon the gate voltage. Capacitors 1004 and 1014 are about 5 pF and much larger than the other stray capacitance of the nodes, so varying the impedance of FETs 1006 and 1016 controls the charge up and discharge times (and thus the delay provided by a delay cell) by controlling an amount of current diverted to charge up or discharge capacitor 1004 or 1014. See FIG. 12b which shows the cell delay as a function of the voltage applied to the gate of FET 1006 and 1016.

The use of FETs 1006 and 1016 together with capacitors 1004 and 1014 as the variable load to generate the delay in the switching of the next cell has two features: (1) the delay only changes slowly as a function of the control voltage, which provides accurate control of the delays, and (2) the input signals propagate trough cell 1000 for all values of the control voltage, thus breakdown in the control voltage will not disable delay line 900.

Figure 13A:
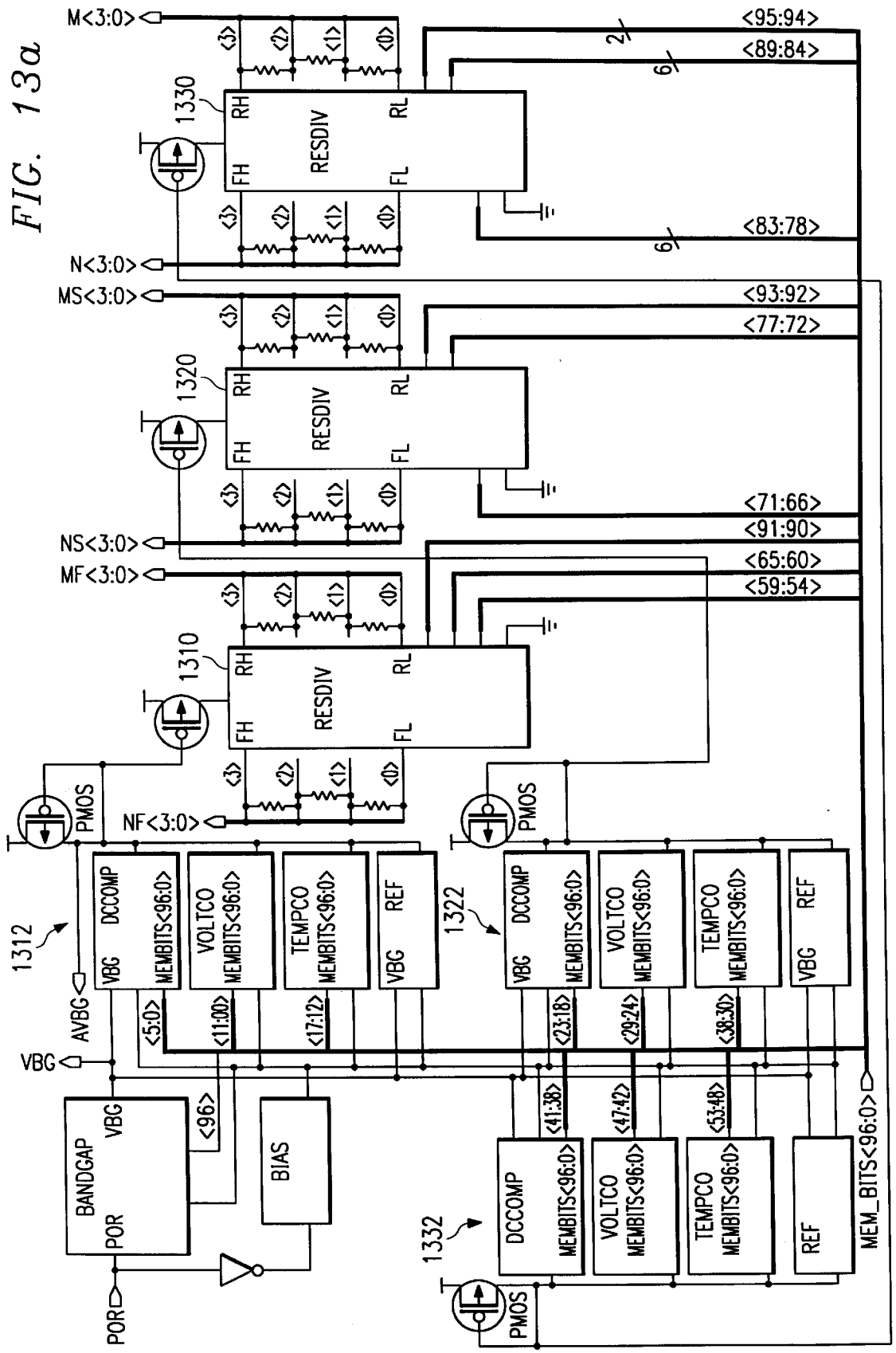
FIGS. 13A–13B are diagrams of various subcircuits of FIG. 9A.
Figure 13B:
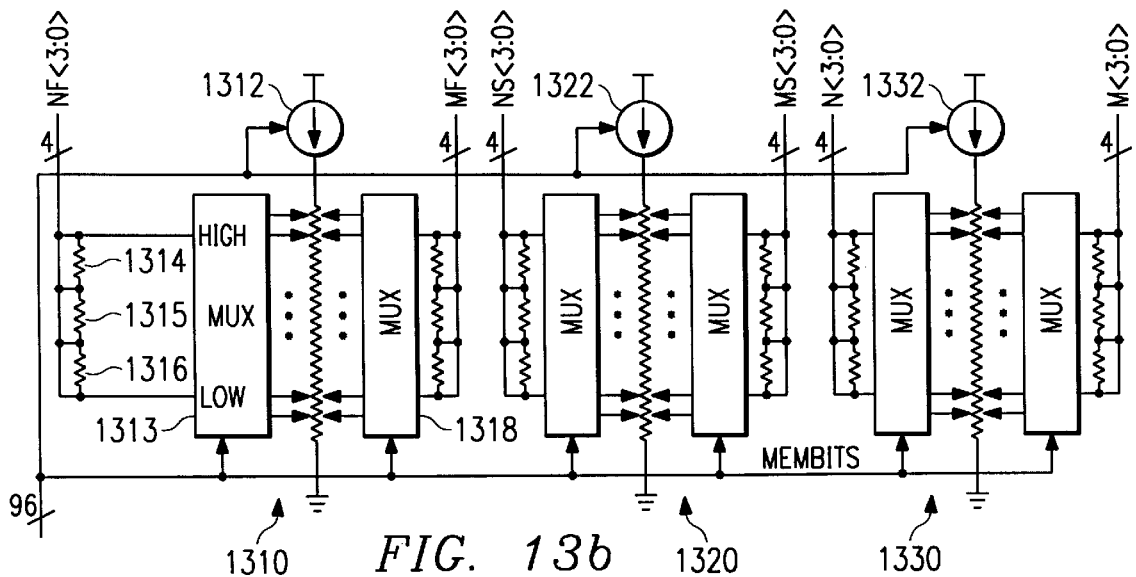

FIG. 13a shows compensated reference voltage block 918 as three resistor strings 1310, 1320, and 1330 driven by corresponding compensated current sources 1312, 1322, and 1332 to generate compensated reference voltages on bus pairs NF<3:0> and MF<3:0>, NS<3:0> and MS<3:0>, and N<3:0> and M<3:0>, respectively. As previously noted, these voltage busses provide voltages to delay cells 921–928 and 931–938 which determine the delay times. The particular voltages put on the bus pairs are selected by the fourteen bits on bus MEMBITS<96:0> for each resistor string; bus MEMBITS<96:0> just contains bits stored in EPROM memory 916. Also, the compensated current sources each has eighteen parameter selection bits on bus MEMBITS<96:0>. FIG. 13b heuristically shows the operation of block 918 as MEMBITS setting currents and selecting resistor taps to select the voltages on the bus pairs NF<3:0> and MF<3:0>, NS<3:0> and MS<3:0>, and N<3:0> and M<3:0>. Indeed, each resistor string has 64 taps (6-bits decoded) and multiplexer 1313 selects two adjacent taps to connect to outputs High and Low. Resistors 1314–1316 connect the High and Low outputs and provide two additional voltages between those at High and Low to makeup the four voltages on bus NF<3:0>. The other multiplexers are similar.

Figure 14C:
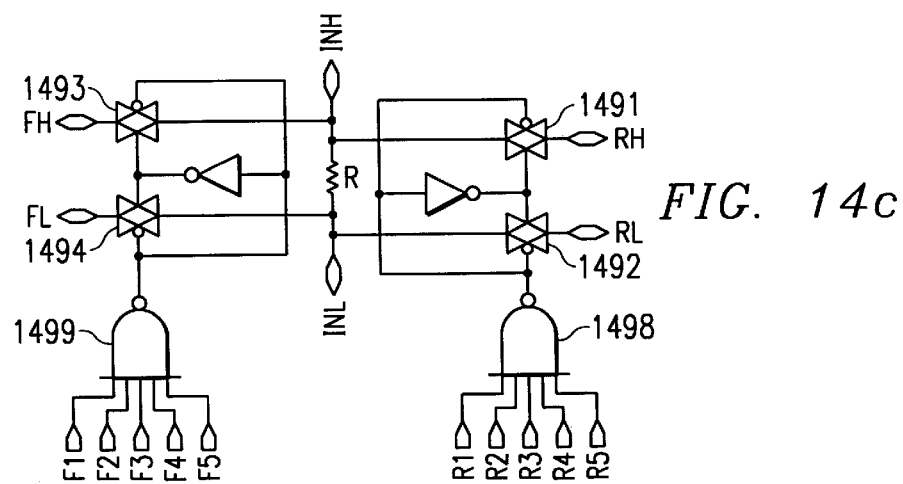
Figure 15B:
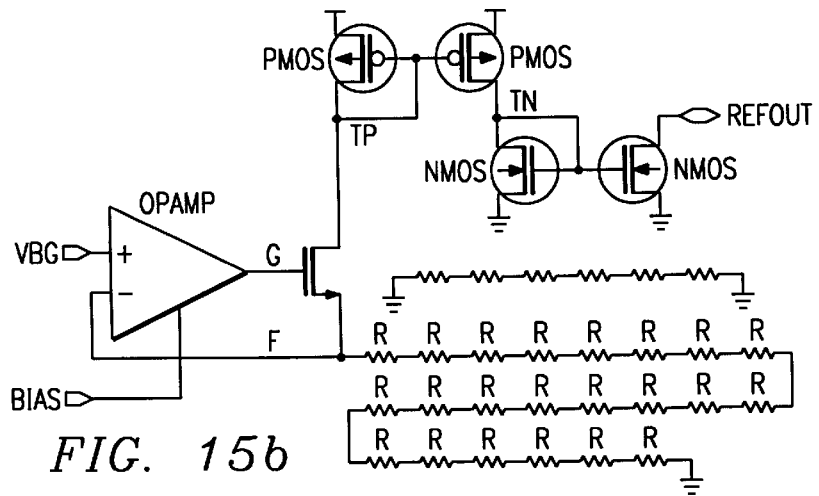
FIGS. 15A–15E are another diagram of various subcircuits of FIG. 9A.
Figure 14A:
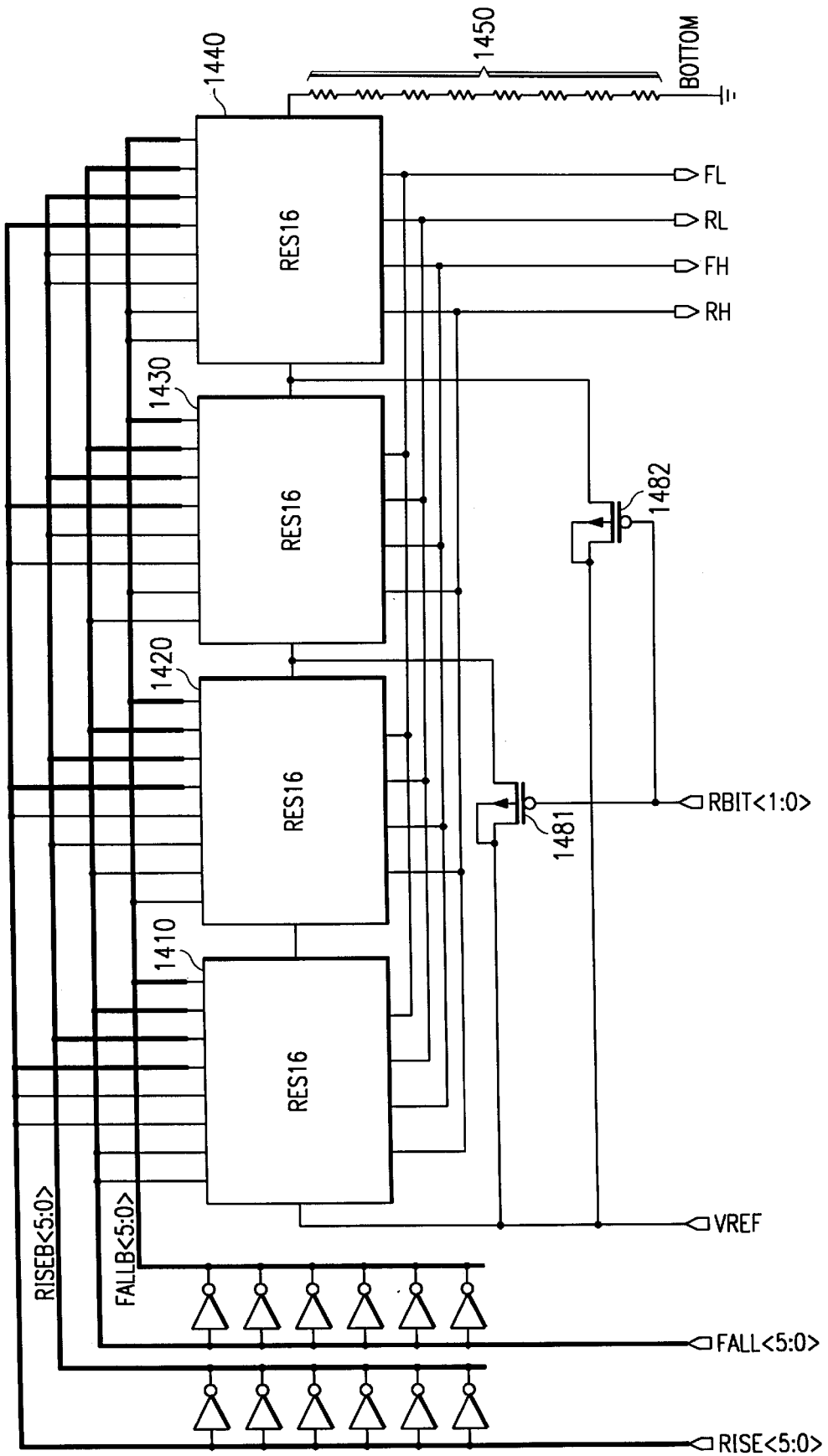

Each of resistor strings 1310, 1320, and 1330 has the structure of the string shown in FIGS. 14a–c which includes four substrings 1410, 1420, 1430, and 1440 in series, each with a nominal total resistance of 16 R, followed by resistor 1450 have a nominal resistance of 8R; current sources 1312, 1322, and 1332 apply current at the VREF node and resistor 1450 connects to ground. The six bits on RISE<5:0> select adjacent taps on the string of 64 substring resistors and connect them to outputs RH (Rise High) and RL (Rise Low) which would be the High and Low multiplexer outputs noted in FIG. 13b. Similarly, the six bits on FALL<5:0> select taps for connection to the outputs FH (Fall High) and FL (Fall Low) which would be the High and Low multiplexer output of the other multiplexer on the resistor string in FIG. 13b; that is, if RISE<5:0> drives multiplexer 1313, then FALL<5:0> drives multiplexer 1318. The two bits on bus RBIT<1:0> permit bypassing substrings 1410 plus 1420 and 1430; this allows for large voltage variation with small resistance. Each of substrings 1410–1440 has the structure shown in FIG. 14b as 16 resistors 1461–1476 in series with each resistor as shown by FIG. 14c. The six bits on RISE<5:0> and FALL<5:0> are decoded as shown in FIG. 14b by the selective connections to resistors 1461–1476 plus the NAND gates in FIG. 14c. FIG. 14c hows that a single resistor in the string connects the selected taps for connection to High and Low outputs.

A numerical example will help explain the operation of resistor strings 1310, 1320, and 1330. First, presume that the voltage at node VREF (FIG. 14a) is 2.5 volts. Now consider the case of RBIT<1:0> with its two bits equal to 11 which turn off p-channel FETs 1481–1482. The resistor string then has 72 equal resistors in series: 16 resistors in each of substrings 1410, 1420, 1430, and 1440 plus 8 resistors in resistor 1450. So the voltage drop across each resistor is about 34.7 mV. Now if the six bits on RISE<5:0> are 101010, then bits 5 and 4 being 10 select substring 1420 via NAND gate 1478 in each substring and bits 3–0 being 1010 select resistor 1471 from the substring by NAND gate 1498 (the r5 input is the inverted output of NAND 1478). Thus the six bits 101010 select the 27th resistor in the string (counting from VREF) by making transmission gates 1491 and 1492 about the 27th resistor conducting. Hence, the RH and RL outputs are about 1.597 and 1.562 volts, respectively. And three resistors analogous to resistors 1314–1316 divide the 34.7 mV difference to provide the two additional voltage output levels of 1.574 and 1.585 volts. This implies the corresponding bus MF<3:0> or MS<3:0> or M<3:0> supplies the four gate voltages 1.597, 1.585, 1.574, and 1.562 volts to the gate of FET 1006 in the corresponding delay cells. Similarly, the six bits on the FALL<5:0> bus determine a resistor in the string (which could possibly be the same 27th resistor) to generate the FH and FL outputs though transmission gates 1493–1494 and, by resistors 1314–1316 voltage division, two intermediate outputs to appear on the NF<3:0> or NS<3:0> or N<3:0> bus to supply four gate voltage choices for FET 1016 in the corresponding delay cells. Note that the available gate voltage can be programmed between a maximum of 2.5 volts (VREF) by six bits equal to 111111 and a minimum of 0.278 volt with the six bits equal 000000. Resistors 1314–1316 have much higher resistances than the resistors in the string, so the fact that resistors 1314–1316 parallel the selected resistor of the string does not significantly change the four available gate voltages.

FIG. 9b illustrates reference voltage busses NF<3:0> and MF<3:0> apply to delay cell 931 (the First delay cell), busses NS<3:0> and MS<3:0> apply to delay cell 921 (the Second delay cell), and busses N<3:0> and M<3:0> apply to the remaining 14 delay cells. Thus the available four gate voltages for each FET in delay of cells 931 and 921 can each be set independently, whereas the available four gate voltage for each FET of the remaining delay cells are all equal. FIG. 9b also shows that the choice among the four available gate voltages (V<3:0> in FIG. 10b) comes from two bits (C<1:0> in FIG. 10b) on bus MEM<0:63> which holds bits stored in EPROM memory 916. Each delay cell has its own two bits, and this allows for individual cell adjustment. Note that the difference of about 12 mV between available voltages which can be applied to the gate of FET 1006 yields a difference of roughly 100 picoseconds in delay time (depending upon the applied gate voltage) and thus the two choice bits relate to a 5% trimming capability after packaging.

Returning to FIG. 14a, now consider the case of the two bits on RBIT<1:0> as 0. This turns on both FET 1481 and 1482 and has VREF bypass substrings 1410, 1420, and 1430. In this case there are effectively only 24 resistors (16 in substring 1440 and 8 in resistor 1450) in the string. Then when the six bits on RISE<5.0> select a resistor in one of the bypassed substrings, both RH and RL are just equal to 2.5 volts (presumed VREF) because the entire substring is at VREF. However, bits 5 and 4 equal to 00 selects are resistor in substring 1440 and the outputs at RH and RL differ by 141.7 mV and may be chosen in the range from 0.833 volt to 2.5 volts. Similarly for FALL<5.0>. Such an alternative range of available gate voltages allows for wider swings in control voltage at the low end.

Figure 15A:
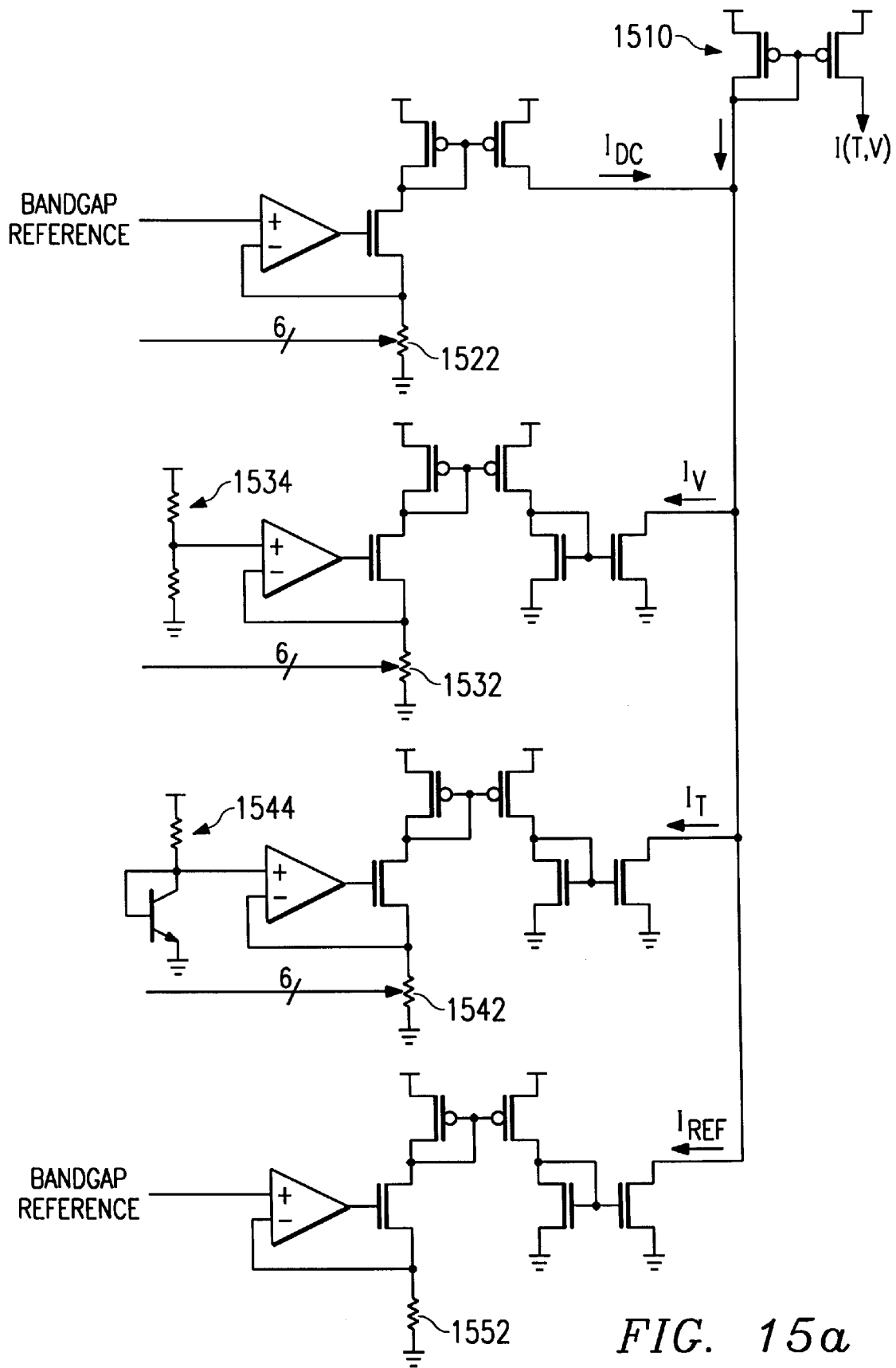
Figure 15C:
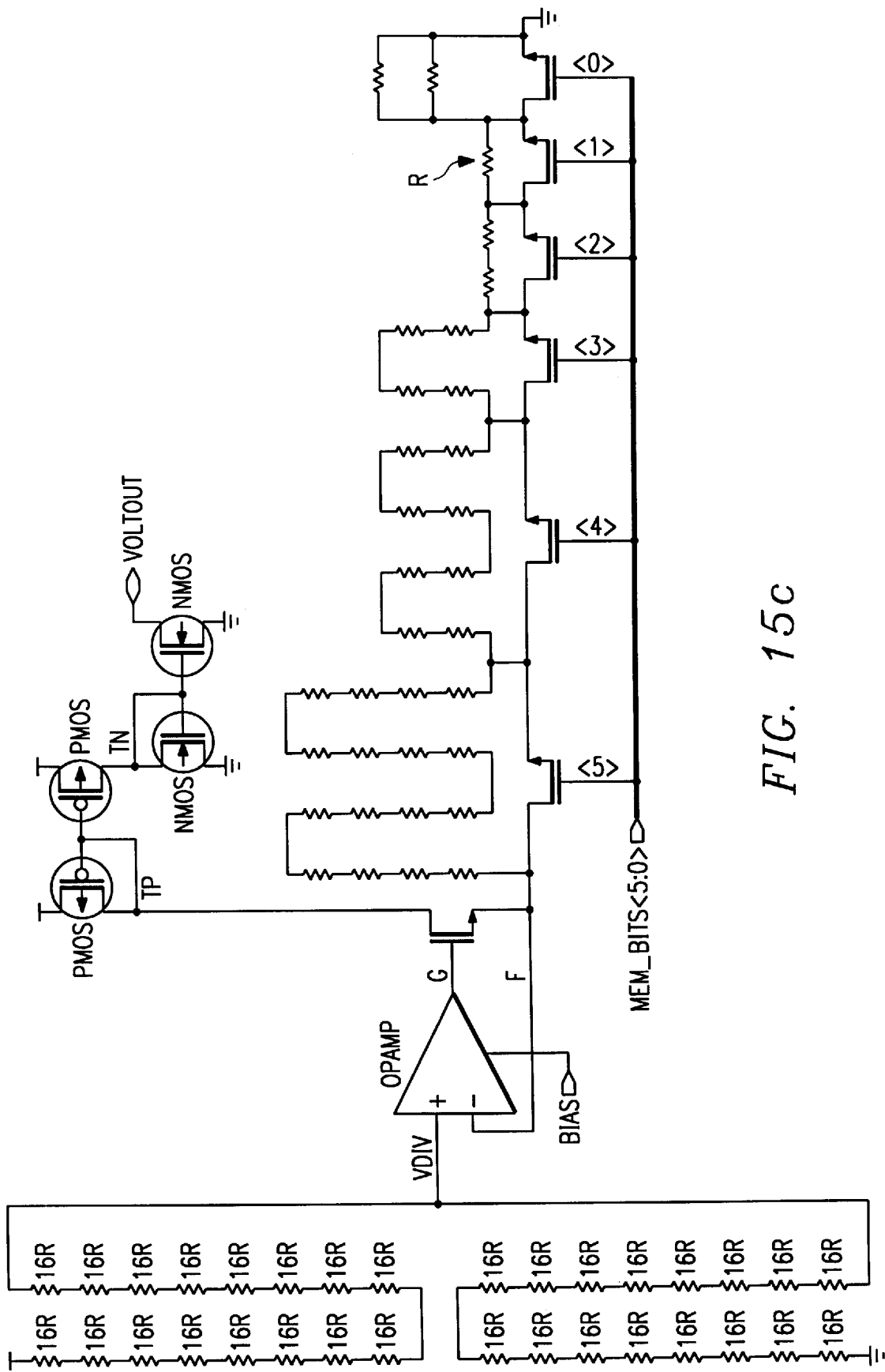
Figure 15D:
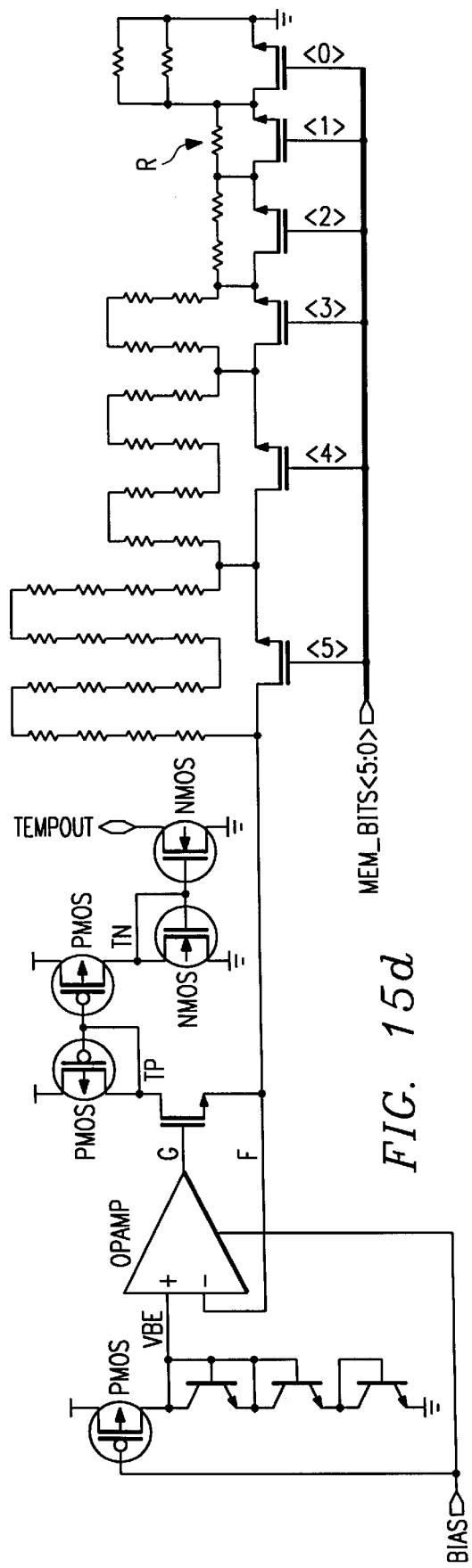
Figure 15E:
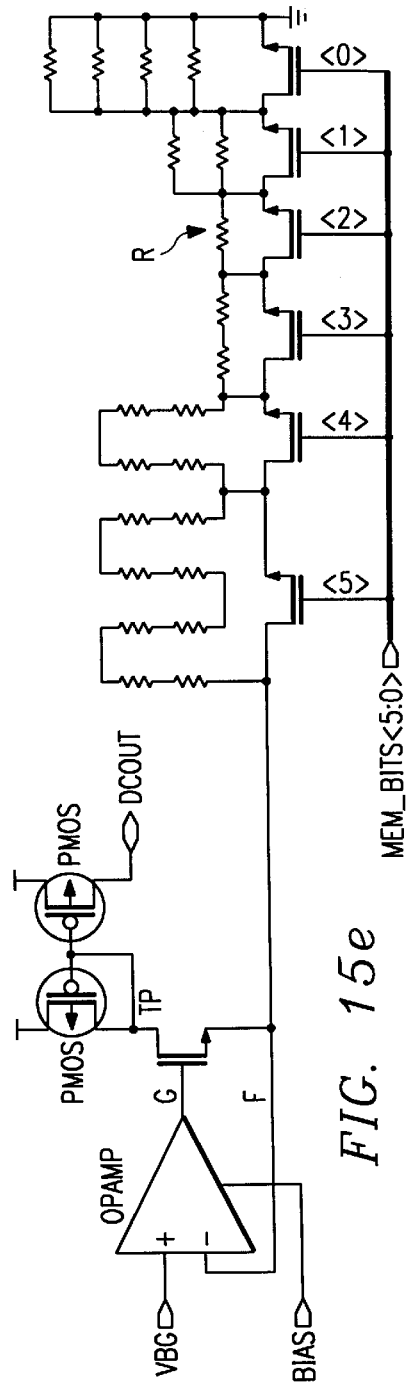

The delay of each delay cell depends upon temperature and supply voltage because the pull up and pull down FETs have saturation currents dependent on these parameters, and the stray capacitance charge up and discharge times depend inversely upon current level. Delay line 900 compensates for temperature and supply voltage variation by dynamic adjustment of the capacitive loading by capacitors 1004 and 1014 in cell 1000. In particular, the gate voltage applied to FETs 1006 and 1016 depends upon the voltages on busses NF<3:0>, MF<3:0>, NS<3:0>, MS<3:0>, N<3:0>, and M<3:0>; and these bus voltages derive from currents from sources 1312, 1322, and 1332 applied to resistor strings 1310, 1320, and 1330. The bits stored in EPROM memory 916 set the resistor string resistances, but the current source currents dynamically adjust to temperature and supply voltage and thereby provide the compensation. In particular, FIG. 15a heuristically shows a current source with dynamic temperature and power supply compensations plus EPROM parameter setting. Current mirror 1510 makes output current $I(T,V)$ equal to the current $I_{REF}-I_{DC}+I_V+I_T$.

The reference current $I_{REF}$ is a mirrored version of the current though resistor 1552 with an applied reference voltage set by a bandgap voltage generator and thus has a relatively small temperature and power supply dependence; indeed, the temperature dependence of resistor 1552 is the primary variation. Rather, current $I_{REF}$ supplies a first approximation current needed with the other currents supplying additive or subtractive corrections. Power supply voltage compensation current $I_V$ increases as power supply voltage increases as follows: resistive voltage divider 1534 feeds one-half of Vdd to the opamp and thus to variable resistor 1532, and the current through resistor 1532 is mirrored to provide $I_V$. Note that an increase in power supply voltage increases the saturation current of a FET, and this would, mutatis mutandi, shorted the delay time of cell 1000. However, increasing $I_V$ will increase $I(T,V)$ which will increase the voltages on busses NF<3:0>, MF<3:0>, NS <3:0>, MS<3:0>, N<3:0>, and M<3:0>and thereby reduce the impedances of FETs 1006 and 1016 and thus increase the capacitive loading of nodes 1008 and 1018 which compensates for the increased saturation current. Six bits in EPROM memory 916 set the resistance of resistor 1532 and thus both the magnitude and sensivity of $I_V$ with respect to power supply variations may be controlled. Temperature compensation current $I_T$ decreases as temperature increases as follows: bipolar diode-resistor voltage divider 1544 feeds a voltage inversely varying with temperature to the opamp and thus to variable resistor 1542, and the current through resistor 1542 is mirrored to provide $I_T$. Note that an increase in temperature decreases the saturation current of a FET, and this would, mutatis mutandi, lengthen the delay time of cell 1000. However, decreasing $I_T$ will decrease $I(T,V)$ which will decrease the voltages on busses NF<3:0>, MF<3:0>, NS<3:0>, MS<3:0>, N<3:0>, and M<3:0> and thereby increase the impedances of FETs 1006 and 1016 and thus derease the capacitive loading of nodes 1008 and 1018 which compensates for the decreased saturation current. Six bits in EPROM memory 916 set the resistance of resistor 1542 and thus both the magnitude and sensivity of $I_T$ with respect to temperature may be controlled. Resistor 1522 with an applied reference voltage set by a bandgap voltage generator provides DC compensation current $I_{DC}$ and thus also has a relatively small temperature and power supply dependence. However, six bits in EPROM memory 916 again sets the resistance of resistor 1522 and provides the programmable offset for the DC levels of $I_V$ and $I_T$ used to set their sensitivities. In short, $I_{REF}$ is a relatively steady current, $I_V$ and $I_T$ are power supply voltage and temperature compensation currents, but setting the sensitivities needed for $I_V$ and $I_T$ by programming EPROM 916 generates a DC offset which $I_{DC}$ takes care of by further programming EPROM 916.

FIGS. 15b–e show the reference, power supply voltage compensation, temperature compensation, and DC level compensation circuits, respectively. Note that the variable resistors provide for 64 resistance settings from the six bits applied by use of binary weighted resistors.

Figure 16:
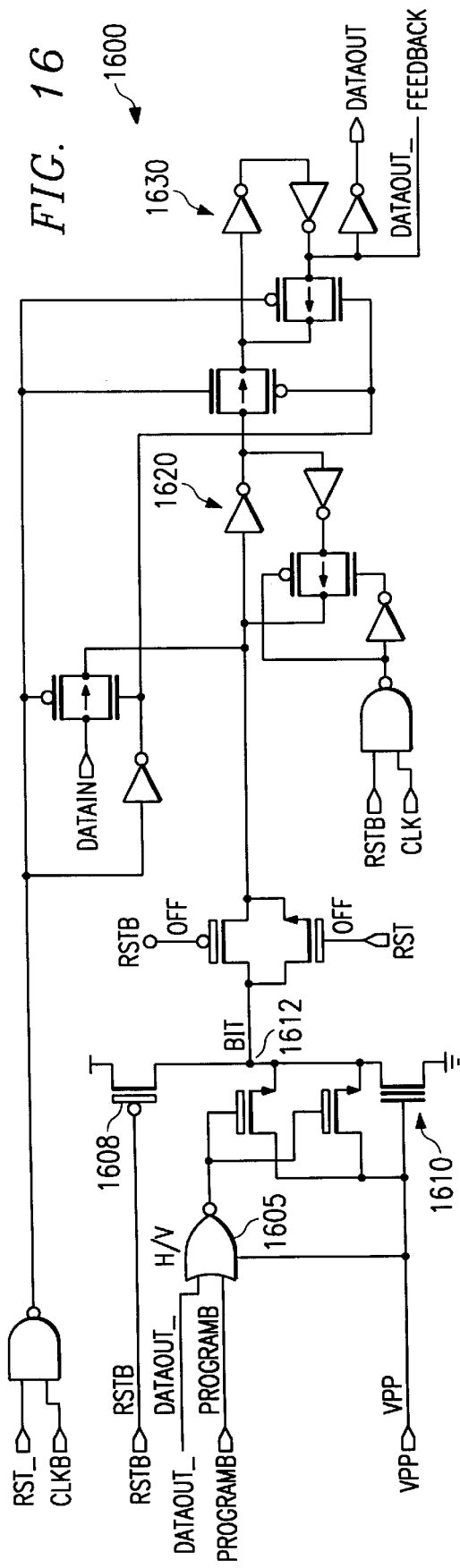
FIG. 16 is another diagram of various subcircuits of FIG. 9A.

EPROM 916 has 160 bits which encompass the following: (1) 64 bits on bus MEM<0:63> (FIG. 9b) with four bits in two pairs for each delay cell to select which of the four gate voltages will be applied to each of the FETs 1006 and 1016 connecting the load capacitors to the nodes; (2) 54 bits to set the three variable resistors in each of the three current sources 1312–1332 with six bits for each resistor (FIG. 15a); and (3) 42 bits to set the resistances in each of the three resistor strings 1310–1330 with six bits for rising edge voltage levels, six bits for falling edge voltage levels, and two bits for substring selection (FIG. 14a). FIG. 16 shows a single bit, denoted by reference numeral 1600, of EPROM 916.

Single bit 1600 performs as follows. First, a bit to be stored is applied at node DATAIN (from the shift register) and clocked (CLKB) into memory cell 1620 and then into memory cell 1630. Cell 1630 (DATAOUT) provides the bits on the bus from EPROM memory 916 to the other parts of delay line 900, including inversion and feeding back to NOR gate 1605. Then with a programming voltage (about 12 volts, depending upon the programming speed desired and the gate oxide thickness and resistance to breakdown) at terminal VPP, a programming voltage is applied to the control gate of n-channel floating gate FET 1610. An active low PROGRAMB applied as the other input of NOR gate 1605, the drain of floating gate FET 1610 is either at programming voltage or is floating, with the former the case when cell 1630 contains a 1 (DATAOUT high) and the latter when it contains a 0. In the former case, floating gate FET 1610 conducts and hot electrons charge its floating gate, whereas in the latter case FET does not conduct. After the programming, a charged floating gate has a sufficiently negative charge to keep FET 1610 turned off even when a high is applied to its control gate, but an uncharged floating gate implies FET 1610 will turn on when a high is applied to its control gate.

When programming is complete, then any reset of delay line 900, such as by powering down and then up again to generate a power on reset pulse, will have an RST pulse high and RSTB pulse low which will turn on FET 1608 and either pull node 1612 high if floating gate FET is programmed for a 1 (nonconducting with a high applied to its control gate) or will remain pulled down by FET 1610 which is programmed for a 0 and conducting. This high or low at node 1612 sets cell 1620 and then 1630 by clocking. Thus the stored bit in floating gate FET 1610 is read.

Figure 17A:
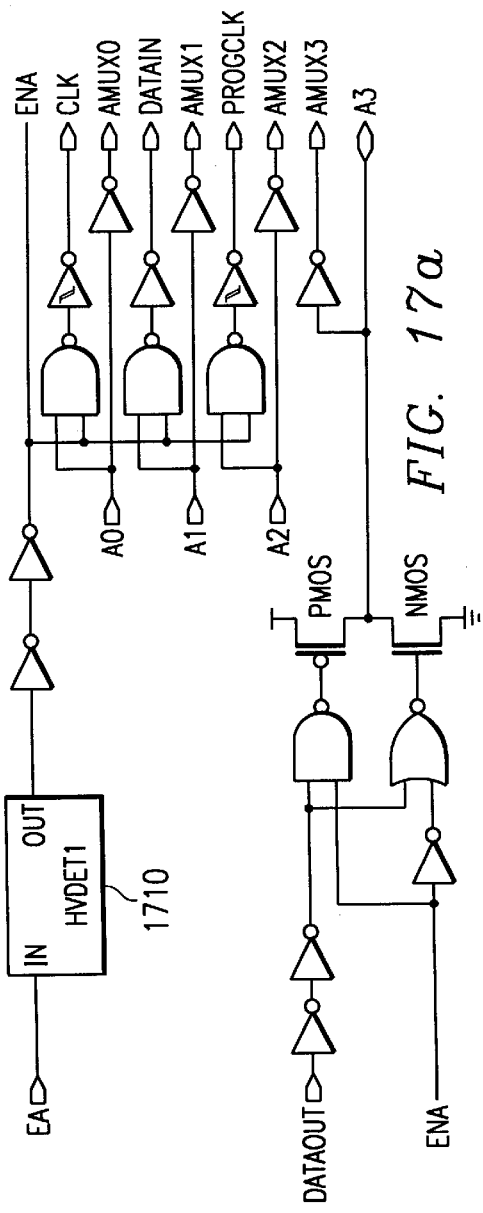
FIGS. 17A–17B are another diagram of various subcircuits of FIG. 9A.
Figure 17B:
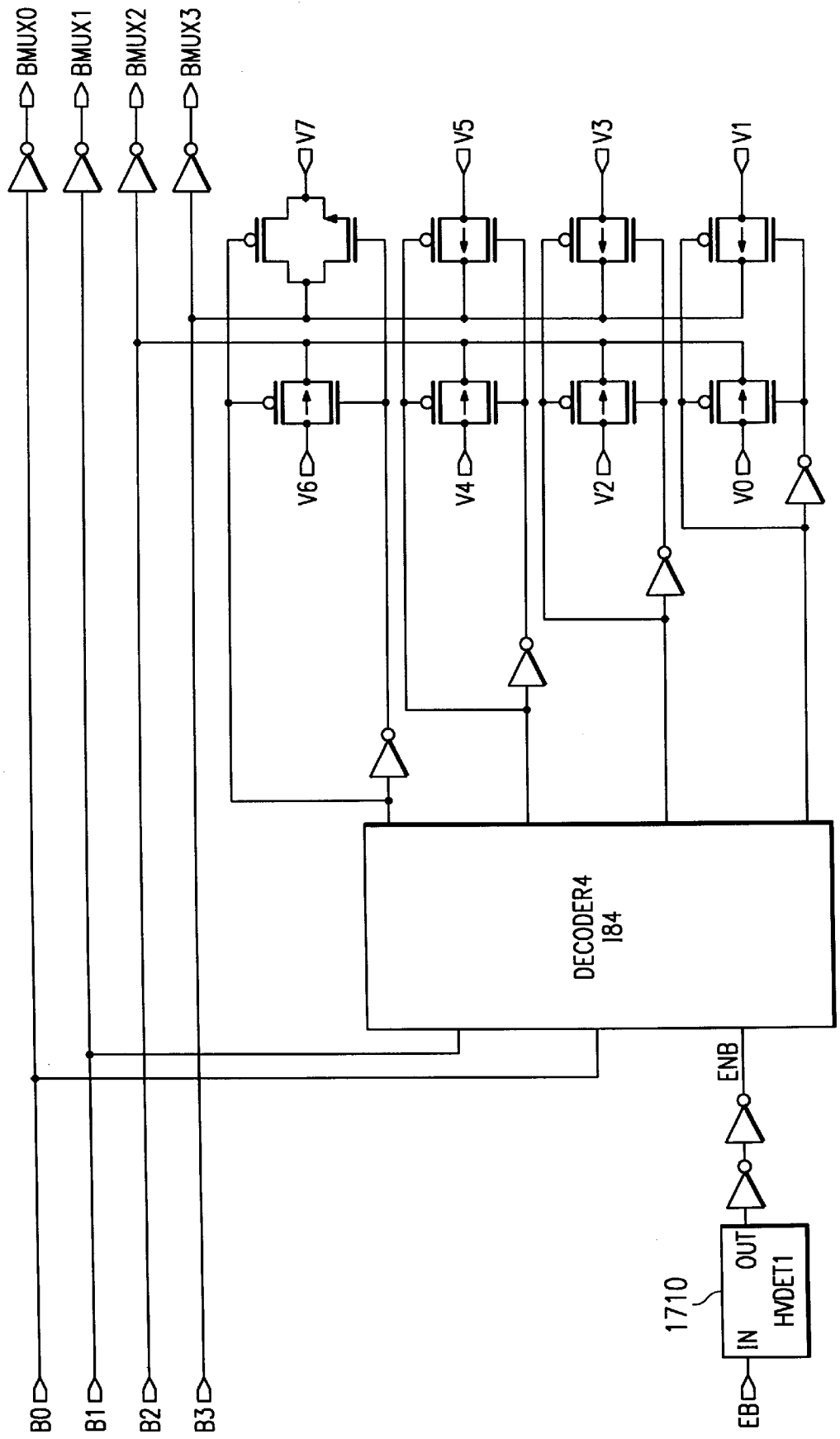
Figure 18A:
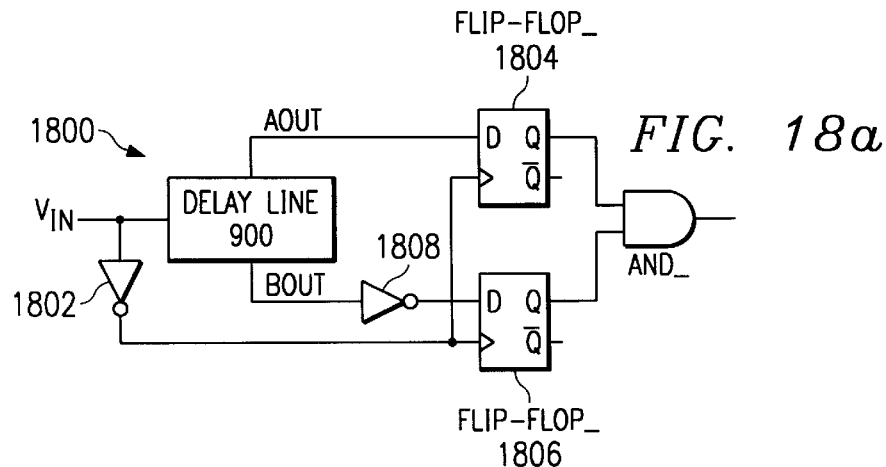

FIGS. 17a–b schematically show interfaces 912 and 914, respectively. Each interface has a high voltage detector 1710 which provides a high output for a programming voltage (12 volts) applied to its input and an low output for either a low (0 volt) or a high (5 volts) applied. This leads to the multiplexed use of terminals (package pins) A0–A3 and B0–B3 as follows. When EA has +12 volts applied, A0 becomes the input terminal for the clock CLK, A1 the serial input terminal for the 160 trim bits, A2 the input terminal for the programming clock PROGCLK, A3 the serial output terminal for reading the 160 trim bits, and B0 and B1 the input terminals for two bits which are decoded to select among the eight test voltages v0–v7 (see FIG. 9a) for the B2 and B3 output terminals. In particular, v0 will be N<3>, v1–v3 will be M<3>, v4 will be the bandgap voltage VBG and v5 the current source voltage AVBG (see FIG. 13a), v6 will be the power-on-reset RST and v7 will be the EPROM test cell DRAIN to check EPROM programming.

Application to Frequency Shift Keying

Figure 18B:
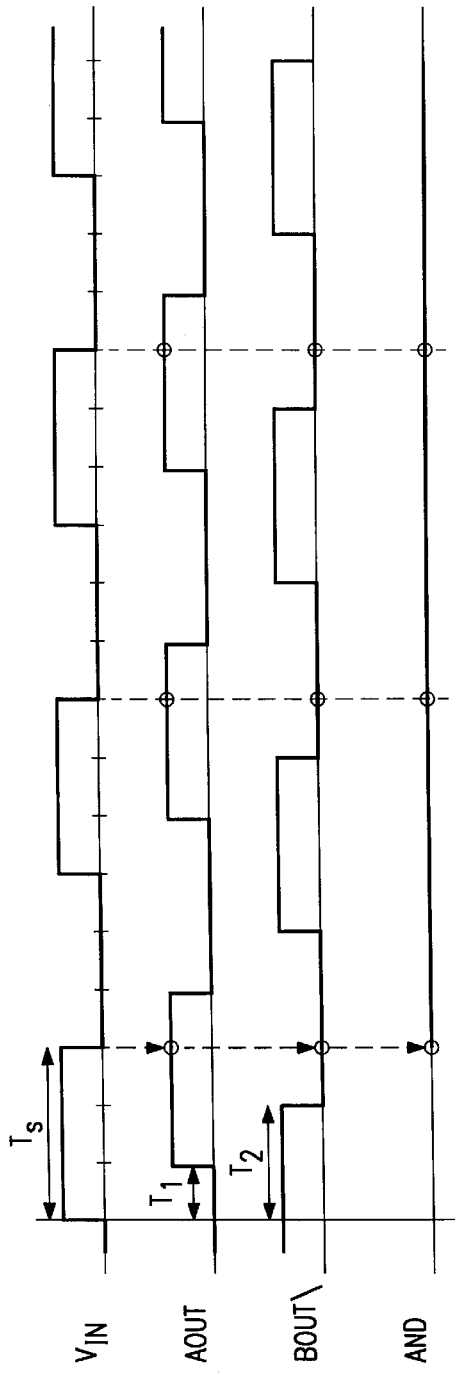

FIG. 1a illustrates delay line 900 applied to frequency shift keying (FSK) signal reception. In particular, receiver 1800 uses both the A and B outputs of delay line 900 to provide two different delay times. Let the two FSK frequencies have periods of $2T_m$ and $2T_s$ for the mark and space frequencies, respectively, and setup delay line 900 so the AOUT signal has a delay of $T_1$ and the BOUT signal (inverted by 1808) has a delay of $T_2$ where $T_1<T_m<T_2<T_s$. Thus during spaces with the received signal Vin at the space frequency, receiver 1800 operates as shown in timing diagram FIG. 18b. Note that inverter 1802 makes flip-flops 1804 and 1806 clock on the falling edge of the received signal. Because $T_s$ is greater than both $T_1$ and $T_2$, the data clocked into flip-flop 1804 will be positive and the data clocked into flip-flop 1806 will be negative; hence AND is low and indicates the received space frequency.

Figure 18C:
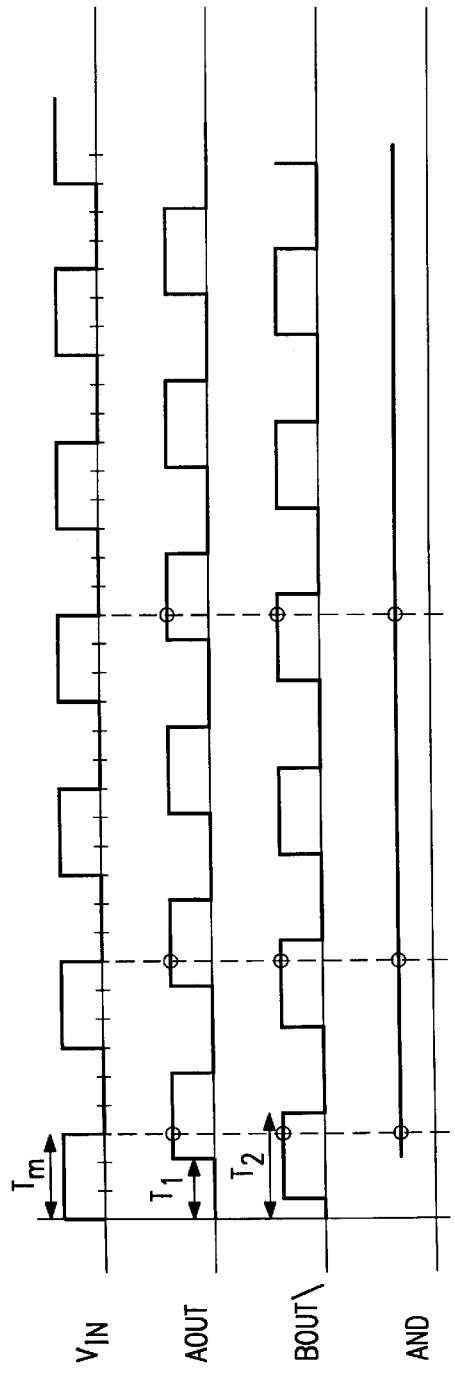

During reception of the mark frequency, receiver 1800 will have AND high because the mark half period $T_m$ fits between the $T_1$ and $T_2$ delays and thus clocks highs into both flip-flops as shown in FIG. 18c. Thus receiver 1800 indicates a received mark frequency with a high output. With $T_1$ as small as 2 nsec, receiver 1800 could receive FSK with mark frequencies approaching 500 MHz; and with $T_2$ as long as 80 nsec, receiver 1800 can handle mark frequencies as low as 12.5 MHz. Note that if the mark frequency increased so that $T_m<T_1$, then the output would switch to low, but with further frequency increase to $2T_m<T_1$ the delays are so large that aliasing occurs.

Figure 19:
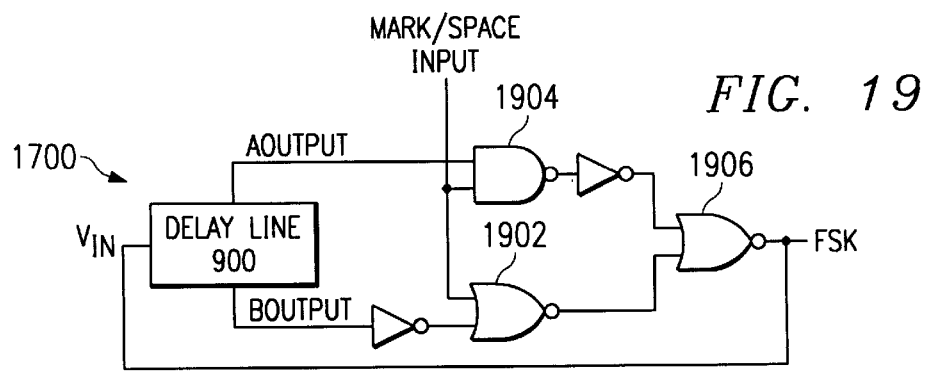

FIG. 19 shows delay line 900 connected as a FSK transmitter; the mark/space input at node Input determines which of A Output and B Output feeds back to the Vin input of delay line 900 and generates oscillations. If A Output replicates the Vin input with a delay of $T_1$ and B Output inverted replicates the complement of the Vin input with a delay of $T_2$, then a high at node Input will drive NOR gate 1906 low and feed Output back to Vin with three inversions. Thus transmitter 1900 will oscillate with period $2T_1$. Similarly, a low at node Input will drive NAND gate 1904 high and feed Output\back to Vin with two inversions, so transmitter will oscillate with a period of $2T_2$. Transmitter 1900 converts the high/low inputs to oscillations at high and low frequencies with periods $2T_1$ and $2T_2$, respectively, which are programmable.

Figure 20A:
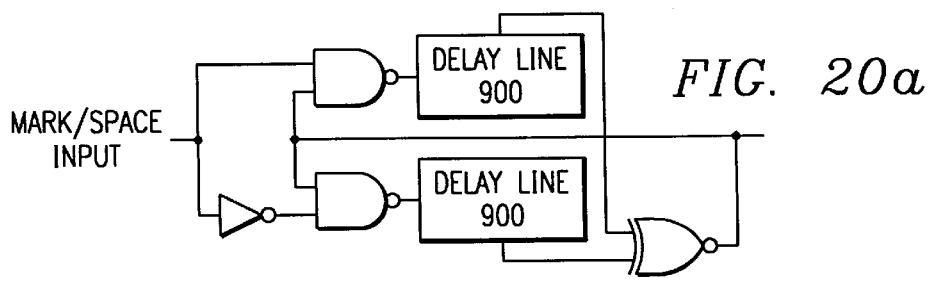
FIGS. 20a–b illustrate alternative FSK receiver and transmitter.
Figure 20B:
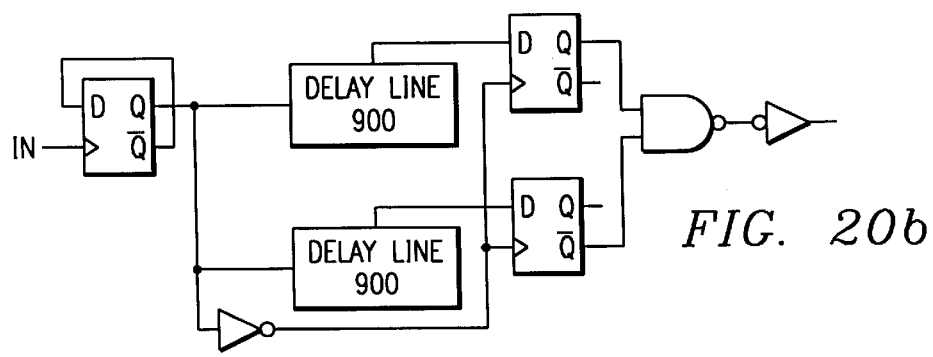

FIGS. 20a–b show further FSK transmitter and receiver embodiments, respectively, which use two delay lines rather than both outputs of a single delay line.

Further Modifications and Variations

The preferred embodiments may be varied in many ways while retaining the features of electrical trimming of a delay line which can be performed after packaging and compatible temperature and voltage compensation.

For example, PROM, EEPROM, flash EEPROM devices could be used (partially) in place of EPROM devices; MNOS, textured poly, EEPROM, and other storage elements in place of the FAMOS elements; and more or fewer numbers of memory cells for greater or less resolution in programming. The memory cells could control/configure other portions of an integrated circuit, such as CMOS switches set by the memory cell bits. More cells could be included in the delay line to provide a larger choice of delays, and differing numbers of resistors and trim bits for differing resolutions.

The in-packaging elecrical trimming of the charging current, the charged capacitance (or impedance coupling a capacitor), or the detection threshold voltage could be all be used or just one of the three trims used, or any two of the trims used. Because the delay time of a delay cell will depend upon the charged capacitance times the increase in capacitor voltage to threshold divided by the charging current, any one of the three could suffice for trimming.

What is claimed is:

1. An integrated circuit comprising:

an input terminal for receiving a string of digital pulses;

an output terminal for transmitting the so received digital pulses;

a means to temperature compensate a voltage source;

a delay cell by use of a variable resistance which comprises a program selection of resistor strings coupled to said input terminal and said output terminal for passing a string of digital pulses inputted from said input terminal to said output terminal;

an adjustable load; and a programmable memory coupled to said variable resistance and said adjustable load, for storing a plurality of data bits wherein said data bits are used for controlling the amount of delay time of said delay cell.

* * * * *

UNITED STATES PATENT AND TRADEMARK OFFICE
CERTIFICATE OF CORRECTION

PATENT NO.   : 5,933,039
DATED        : August 3, 1999
INVENTOR(S)  : Titkwan Hui et al.

It is certified that error appears in the above-identified patent and that said Letters Patent is hereby corrected as shown below:

Column 2,
Line 1, Delete "deleys" Insert -- delays --
Line 19, Delete "mesurement" Insert -- measurement --

Column 4,
Line 2, Delete "termial" Insert -- terminal --

Column 5,
Line 41, Delete "dischrage" Insert -- discharge --

Column 7,
Line 26, Delete "of" Insert -- Of --
Line 52, Delete "trough" Insert "through"
Line 54, Delete "decrased" Insert -- decreased --

Column 10,
Line 35, Delete "tan" Insert -- than --
Line 61, Delete "resepctively" Insert -- respectively --

Column 11,
Line 9, Delete "trough" Insert -- through --
Line 33, Delete "makeup" Insert -- make up --
Line 39, Delete "16 R" Insert -- 16R --
Line 59, Delete "hows" Insert -- shows --

Column 12,
Line 21, Delete "though" Insert -- through --
Line 56 and 62, Delete "<5.0>" Insert -- <5:0> --

Column 13,
Line 38, Delete "sensivity" Insert -- sensitivity --

UNITED STATES PATENT AND TRADEMARK OFFICE
CERTIFICATE OF CORRECTION

PATENT NO. : 5,933,039
DATED : August 3, 1999
INVENTOR(S) : Titkwan Hui et al.

It is certified that error appears in the above-identified patent and that said Letters Patent is hereby corrected as shown below:

<u>Column 16,</u>
Line 22, Delete "elecrical" Insert -- electrical --

Signed and Sealed this

Thirteenth day of November, 2001

Attest:

*Attesting Officer*

NICHOLAS P. GODICI
*Acting Director of the United States Patent and Trademark Office*